United States Patent
Kim et al.

(10) Patent No.: US 7,183,600 B2
(45) Date of Patent: Feb. 27, 2007

(54) SEMICONDUCTOR DEVICE WITH TRENCH GATE TYPE TRANSISTOR AND METHOD OF MANUFACTURING THE SAME

(75) Inventors: Yong-Jin Kim, Suwon-si (KR);
Kyeong-Koo Chi, Seoul (KR);
Chang-Jin Kang, Suwon-si (KR);
Hyoung-Sub Kim, Yongin-si (KR);
Myeong-Cheol Kim, Suwon-si (KR);
Tae-Rin Chung, Gunpo-si (KR);
Sung-Hoon Chung, Suwon-si (KR);
Ji-Young Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 200 days.

(21) Appl. No.: 10/858,727

(22) Filed: Jun. 2, 2004

(65) Prior Publication Data
US 2005/0001252 A1    Jan. 6, 2005

(30) Foreign Application Priority Data
Jun. 3, 2003   (KR) .................. 10-2003-0035608
Sep. 16, 2003  (KR) .................. 10-2003-0064202

(51) Int. Cl.
*H01L 29/76* (2006.01)

(52) U.S. Cl. .................... 257/295; 257/295; 257/296; 257/E29.2

(58) Field of Classification Search ............... 257/296, 257/295, 297
See application file for complete search history.

(56) References Cited

U.S. PATENT DOCUMENTS

| | | | | |
|---|---|---|---|---|
| 6,037,194 A | * | 3/2000 | Bronner et al. | 438/147 |
| 6,317,360 B1 | * | 11/2001 | Kanamori | 365/185.01 |
| 6,498,062 B2 | * | 12/2002 | Durcan et al. | 438/246 |

* cited by examiner

*Primary Examiner*—Andy Huynh
*Assistant Examiner*—Thinh T Nguyen
(74) *Attorney, Agent, or Firm*—F. Chau & Associates, LLC

(57) ABSTRACT

A semiconductor device includes a plurality of gate trenches, each of which has first inner walls, which face each other in a first direction which is perpendicular to a second direction in which active regions extend, and second inner walls, which face each other in the second direction in which the active regions extends. An isolation layer contacts a gate insulating layer throughout the entire length of the first inner walls of the gate trenches including from entrance portions of the gate trenches to bottom portions of the gate trenches, and a plurality of channel regions are disposed adjacent to the gate insulating layers in the semiconductor substrate along the second inner walls and the bottom portions of the gate trenches.

10 Claims, 23 Drawing Sheets

SEMICONDUCTOR DEVICE WITH TRENCH GATE TYPE TRANSISTOR AND METHOD OF MANUFACTURING THE SAME

BACKGROUND OF THE INVENTION

This application claims priority to Korean Patent Application No. 2003-35608, filed on Jun. 3, 2003, and Korean Patent Application No. 2003-64202, filed on Sep. 16, 2003, in the Korean Intellectual Property Office, the disclosures of which are incorporated herein by reference in their entirety.

1. Technical Field

The present disclosure relates to a semiconductor device and a method of manufacturing the same, and more particularly, to a semiconductor device with a trench gate type transistor and a method of manufacturing the same.

2. Discussion of Related Art

As the integration density of semiconductor devices, such as DRAMs, has increased, the size of memory cells has been scaled down. A reduction in the memory cell size requires a reduction in the size of cell transistors. Thus, many new methods have been developed to secure a predetermined cell capacitance in a memory cell having a reduced size cell transistor. Cell transistors are required to maintain excellent characteristics despite their reduction in size. Thus, various methods of controlling the concentration of impurity ions in diffusion layers have been proposed. However, as the channel length is reduced, it is difficult to control the depth of the diffusion layers during a semiconductor device manufacturing process that includes various thermal processes. Also, since the effective channel length is decreased and the threshold voltage is reduced, a short channel effect may occur, which seriously degrades the operation of the cell transistors.

A trench gate type transistor, in which a trench is formed in a surface of a substrate and a gate electrode is formed in the trench, has been developed. The trench gate type transistor can improve short channel effects in the transistor because the gate electrode is formed in the trench to extend a source-drain distance and increase the effective channel length.

In conventional methods of manufacturing a trench gate type transistor, an isolation region is formed that defines an active region in a semiconductor substrate, and then a trench is formed in the active region of the semiconductor substrate to form a gate electrode (for example, refer to U.S. Pat. No. 6,476,444 and U.S. Pat. No. 6,498,062).

However, if the trench, which is required for forming the gate electrode, is formed after the isolation region is formed as described above, an undesired short channel may be formed between the isolation region and the gate electrode when a distance between the isolation region and the gate electrode is short.

The formation of the undesired short channel will be described in more detail with reference to FIG. 1. FIG. 1 is a sectional view of a conventional semiconductor device. Referring to FIG. 1, an isolation region 12 is formed by a shallow trench isolation (STI) process in a semiconductor substrate 10. A sidewall 12a of the isolation region 12, which contacts an active region 14, is sloped due to a taper etch process. When a gate trench 16 is formed to form a gate electrode 20, a sidewall 16a of the gate trench 16 is also sloped due to a taper etch process. As a result, when a distance between the isolation region 12 and the gate electrode 20 is sufficiently small, as illustrated in FIG. 1, after a cell transistor is completed, a narrow silicon region 18 caused by the sloped sidewalls 12a and 16a may remain between the isolation region 12 and the gate electrode 20 in the semiconductor substrate 10. The silicon region 18 leads to an undesired channel between the isolation region 12 and the gate electrode 20. As a result, the cell transistor cannot ensure a sufficient threshold voltage.

A method of controlling an angle of inclination of a trench profile during an etch process for forming a gate trench or a method of using a wet etch process may be considered. However, these methods cannot completely remove a remaining silicon region between an isolation region and a gate electrode. Consequently, an undesired short channel may remain, thus adversely affecting the reliability of the resultant transistor.

SUMMARY OF THE INVENTION

A semiconductor device according to an exemplary embodiment of the invention includes a semiconductor substrate disposed in a cell array region and including a plurality of active regions, and a plurality of gate trenches formed in each of the plurality of active regions, each of the gate trenches having first inner walls, which face each other in a first direction, which is perpendicular to a second direction in which the active regions extend, and second inner walls, which face each other in the second direction in which the active regions extend. A plurality of gate insulating layers is disposed on the first and second inner walls of each of the plurality of gate trenches. Each of a plurality of gate electrodes includes a bottom gate portion, which fills one of the gate trenches, and a top gate portion, which is disposed on the semiconductor substrate and extends in the first direction. An isolation layer contacts the gate insulating layer throughout the entire length of the first inner walls of the gate trenches including from entrance portions of the gate trenches to bottom portions of the gate trenches. A plurality of source/drain regions is disposed in the semiconductor substrate on both sides of each of the gate electrodes. A plurality of channel regions is disposed adjacent to the gate insulating layers in the semiconductor substrate along the second inner walls and the bottom portions of the gate trenches.

A semiconductor device according to another exemplary embodiment of the invention includes a semiconductor substrate including a plurality of active regions, and a plurality of gate trenches formed in each of the plurality of active regions, each of the gate trenches having inner walls. Each of a plurality of gate insulating layers is disposed on a corresponding inner wall of each of the plurality of gate trenches. Each of a plurality of gate electrodes includes a bottom gate portion, which fills a corresponding gate trench, and a top gate portion, which is disposed over the semiconductor substrate. An isolation layer contacts the gate insulating layer throughout an entire length of the gate trenches including from entrance portions of the gate trenches to bottom portions of the gate trenches. A plurality of source/drain regions is disposed in the semiconductor substrate at both sides of each of the gate electrodes, and a plurality of channel regions is disposed adjacent to the gate insulating layers in the semiconductor substrate along the bottom portions of the gate trenches.

The width of the bottom gate portion of each of the gate electrodes in the first direction can be defined by the isolation layer.

A method of manufacturing a semiconductor device according to an exemplary embodiment of the invention includes forming a plurality of gate trenches in a semiconductor substrate to extend in a first direction, forming a sacrificial layer over the plurality of gate trenches such that the plurality of gate trenches are filled, and forming isolation trenches in the semiconductor substrate, the isolation trenches defining a plurality of active regions that extend in a second direction that is perpendicular to the first direction. An isolation layer is formed by filling the isolation trenches with an insulating material, the isolation layer defining the active regions. Gate regions in the active regions are exposed by completely removing the sacrificial layer from the gate trenches. A gate insulating layer is formed in the gate regions, and a plurality of gate electrodes are formed over the gate insulating layer, each of the plurality of gate electrodes being formed in a corresponding gate trench.

In at least one embodiment of the invention, the semiconductor substrate can be formed of silicon, and the sacrificial layer can be formed of silicon nitride. The sacrificial layer can have a planarized surface and cover a top surface of the semiconductor substrate.

The isolation trenches can be formed deeper than the gate trenches. The forming of the isolation trenches can include forming a mask pattern on the sacrificial layer that covers the active regions, and anisotropically etching the sacrificial layer and the semiconductor substrate by using the mask pattern as an etch mask. The etching of the sacrificial layer and the semiconductor substrate can include a single etch process using a first etch gas that has an etch selectivity between the sacrificial layer and the semiconductor substrate that ranges from about 1:3 to about 3:1.

In at least one other embodiment of the invention, the semiconductor substrate can be formed of silicon, the sacrificial layer can be formed of silicon nitride, and the first etch gas can contain a gaseous mixture of $CF_4$ and $CHF_3$. The first etch gas can further contain at least one of $Cl_2$ and HBr.

The forming of the sacrificial layer can include forming a SiGe layer on the semiconductor substrate to a sufficient thickness such that it fills the gate trenches, and forming the sacrificial layer that fills the gate trenches and simultaneously exposing the top surface of the semiconductor substrate by removing a portion of the SiGe layer using a wet etch process. The removing of the portion of the SiGe layer can be performed using an etchant such as, for example, $NH_4OH/H_2O_2/H_2O$, $HF/HNO_3/H_2O$, $HF/H_2O_2/H_2O$, and $HF/H_2O_2/CH_3COOH$.

The forming of the gate trenches can be performed by using a first mask pattern that is formed on the semiconductor substrate as an etch mask, and the SiGe layer can be formed on the gate trenches and the first mask pattern. The removing of the portion of the SiGe layer can include polishing the SiGe layer by chemical mechanical polishing until the top surface of the first mask pattern is exposed. A portion of the polished SiGe layer can be removed using an etchant such as, for example, $NH_4OH/H_2O_2/H_2O$, $HF/HNO_3/H_2O$, $HF/H_2O_2/H_2O$, and $HF/H_2O_2/CH_3COOH$, such that the sacrificial layer remains only within the gate trenches.

The forming of the isolation trenches can include forming a second mask pattern on the top surfaces of the semiconductor substrate and the sacrificial layer such that the active regions are covered, and dry etching the sacrificial layer and the semiconductor substrate by using the second mask pattern as an etch mask. The etching of the sacrificial layer and the semiconductor substrate can be performed using a gaseous mixture of $Cl_2$ and HBr as an etch gas. The etch gas can further contain an $H_2$ gas.

The exposing of the gate regions can be performed using an etchant such as, for example, $NH_4OH/H_2O_2/H_2O$, $HF/HNO_3/H_2O$, $HF/H_2O_2/H_2O$, and $HF/H_2O_2/CH_3COOH$.

BRIEF DESCRIPTION OF THE DRAWINGS

The above and other features and advantages of the present invention will become more apparent by describing in detail exemplary embodiments thereof with reference to the attached drawings in which:

FIGS. 4A and 4B through 13A and 13B are cross-sectional views illustrating a method of manufacturing a semiconductor device according to an embodiment of the present invention;

FIGS. 14A and 14B through 21A and 21B are cross-sectional views illustrating a method of manufacturing a semiconductor device according to another embodiment of the present invention.

DETAILED DESCRIPTION OF THE INVENTION

Figure 1:
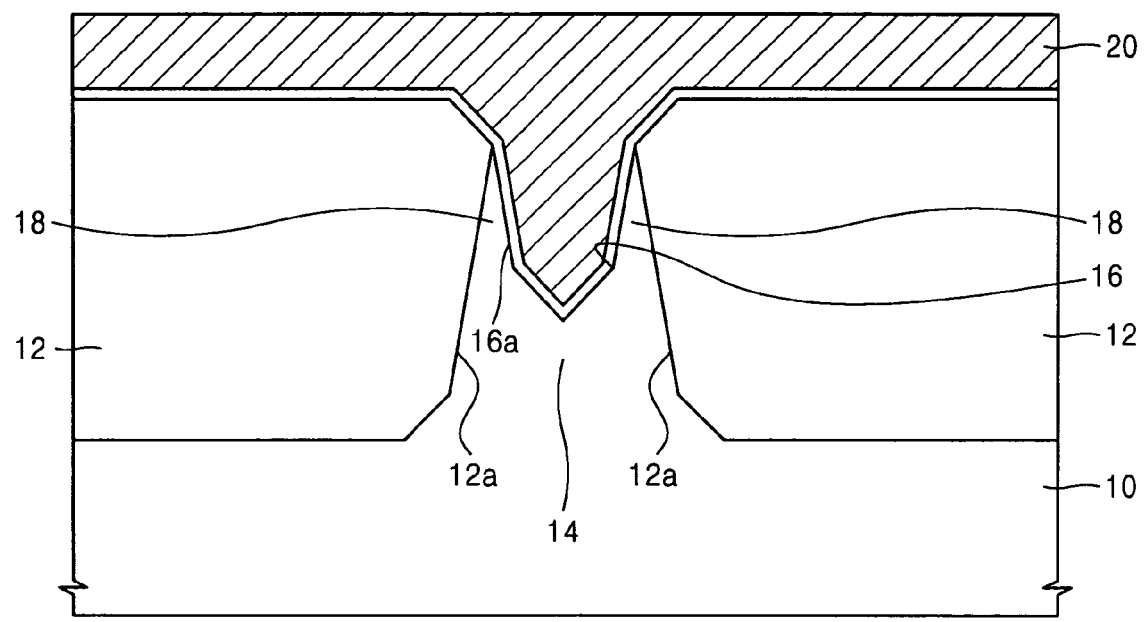
FIG. 1 is a sectional view of a conventional semiconductor device.
Figure 2:
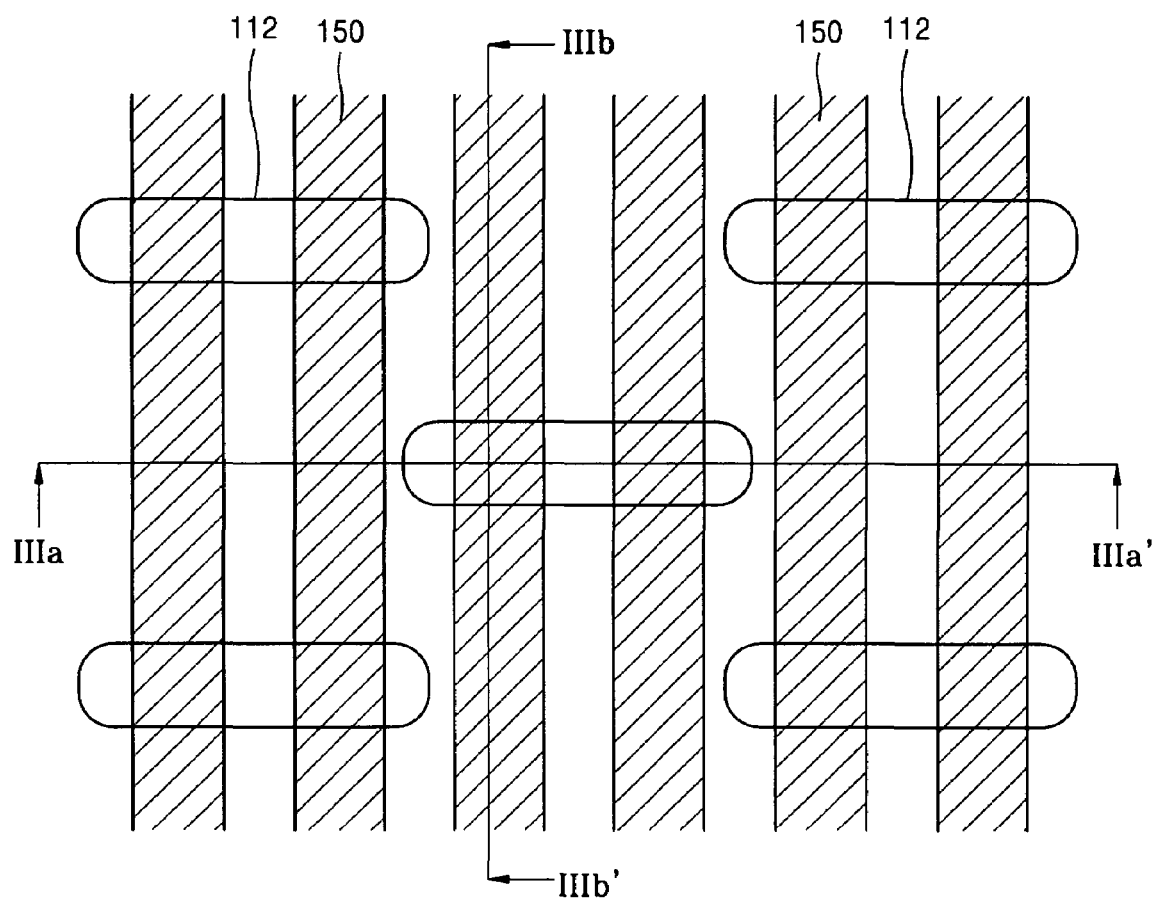
FIG. 2 is a diagram of a partial layout of a cell array region of a semiconductor device according to an exemplary embodiment of the present invention.
Figure 2:
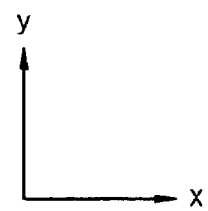
Figure 3A:
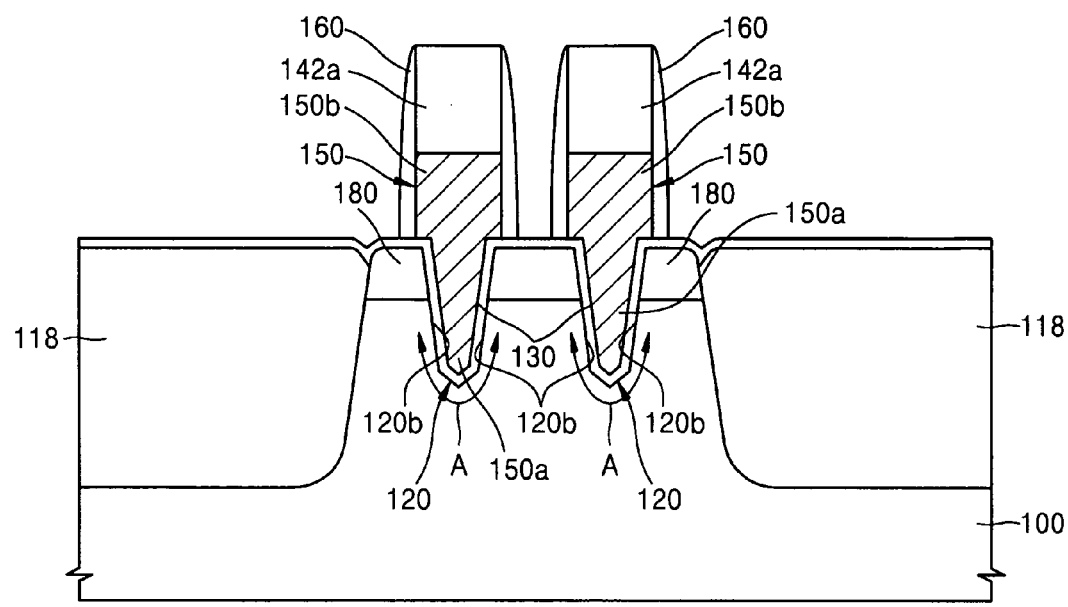
FIG. 3A is a sectional view taken along line IIIa–IIIa' of FIG. 2.
Figure 3B:
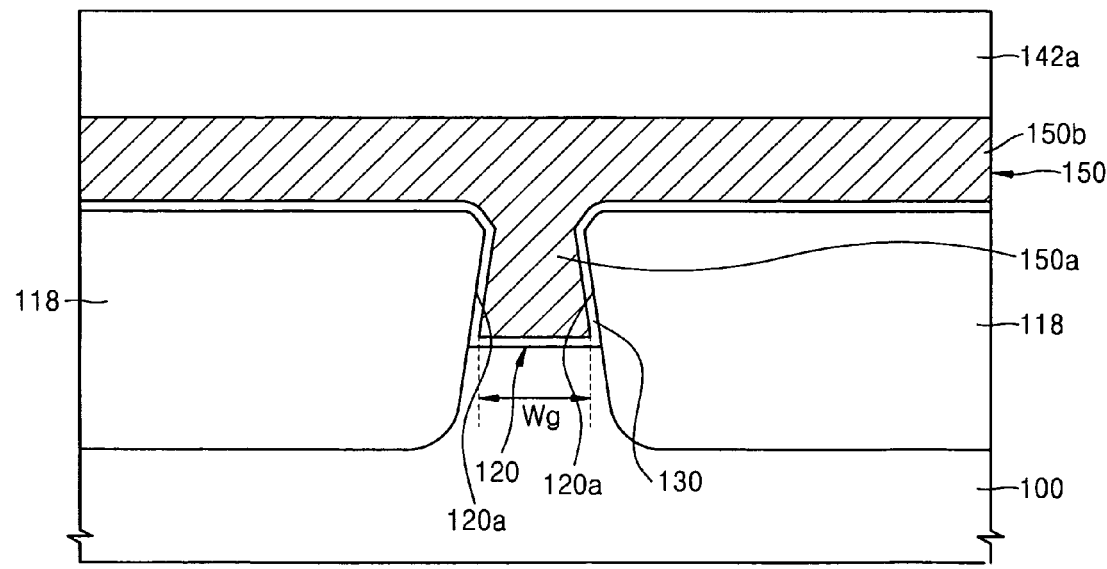
FIG. 3B is a sectional view taken along line IIIb–IIIb' of FIG. 2.

FIGS. 2, 3A, and 3B illustrate the structure of a semiconductor device according to an exemplary embodiment of the present invention. More specifically, FIG. 2 is a diagram of a partial layout of a cell array region of a semiconductor device according to an exemplary embodiment of the present invention. FIG. 3A is a sectional view taken along line IIIa–IIIa' of FIG. 2, and FIG. 3B is a sectional view taken along line IIIb–IIIb' of FIG. 2.

Referring to FIGS. 2, 3A, and 3B, a semiconductor device according to the present embodiment includes a plurality of straight-type active regions 112, which are formed on a semiconductor substrate 100 and extend in a direction x. The active regions 112 are defined by isolation layers 118 formed in the semiconductor substrate 100. A plurality of gate electrodes 150 extend in a direction y that is perpendicular to the direction x, in which the active regions 112 extend.

Each of the gate electrodes 150 includes a bottom gate portion 150a, which fills a gate trench 120 and is recessed in the semiconductor substrate 100, and a top gate portion 150b, which is disposed on the semiconductor substrate 100 and extends in the direction y perpendicular to the active region 112. As illustrated in FIG. 3B, the width of the bottom gate portion 150a of the gate electrode 150, which is measured in the direction y, in which the gate electrode 150 extends, is defined by the isolation layer 118. Also, as shown in FIG. 3B, the width Wg of the bottom gate portion 150a is greatest at its bottom.

The gate trench 120 has first inner walls 120a, which face each other perpendicular to the direction in which the active region 112 extends, i.e., in the direction y, and second inner walls 120b, which face each other in the direction in which the active region 112 extends, i.e., in the direction x.

A gate insulating layer 130 is formed between the semiconductor substrate 100 and the gate electrode 150. The gate insulating layer 130 contacts the isolation region 118 within the gate trench 120 throughout the entire length of the first inner walls 120a including from a top surface of the semiconductor substrate 100 (i.e., an entrance portion of the gate trench 120) to the bottom of the gate trench 120

As shown in FIG. 3A, a plurality of source/drain regions 180 are formed adjacent to the second inner sidewalls 120b on both sides of the gate electrode 150 in the semiconductor substrate 100. Accordingly, a plurality of channel regions may be formed adjacent the second inner walls 120b and the bottom of the gate trench 120 in a direction A. However, as shown in FIG. 3B, since the gate insulating layer 130 contacts the isolation region 118 within the gate trench 120 throughout the entire length of the first inner walls 120a including from the entrance portion of the gate trench 120 to the bottom of the gate trench 120, undesired channels are not formed between the isolation region 118 and the gate electrode 150.

FIGS. 4A and 4B through 13A and 13B are cross-sectional views illustrating a method of manufacturing a semiconductor device according to an embodiment of the present invention. Here, FIGS. 4A, 5A, . . . , and 13A are sectional views corresponding to the section taken along line IIIa–IIIa' of FIG. 2, and FIGS. 4B, 5B, . . . , and 13B are sectional views corresponding to the section taken along line IIIb–IIIb' of FIG. 2.

Figure 4A:
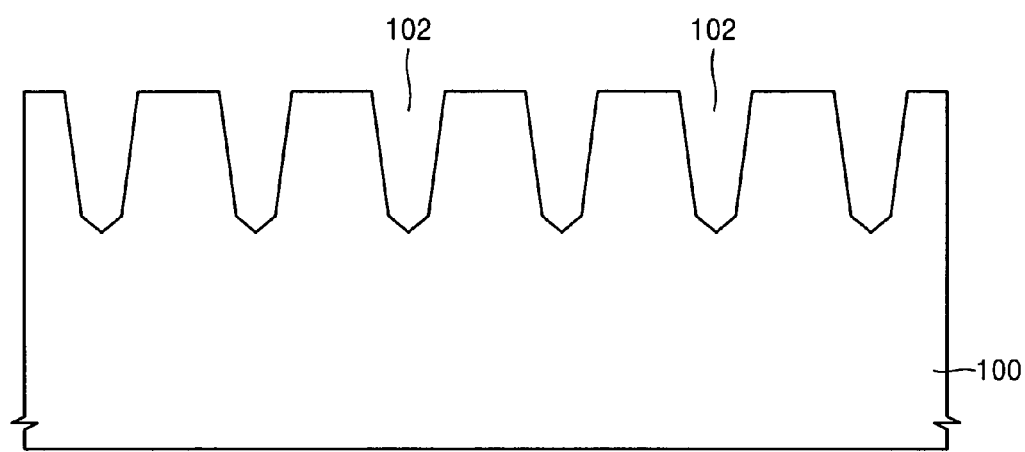
Figure 4B:
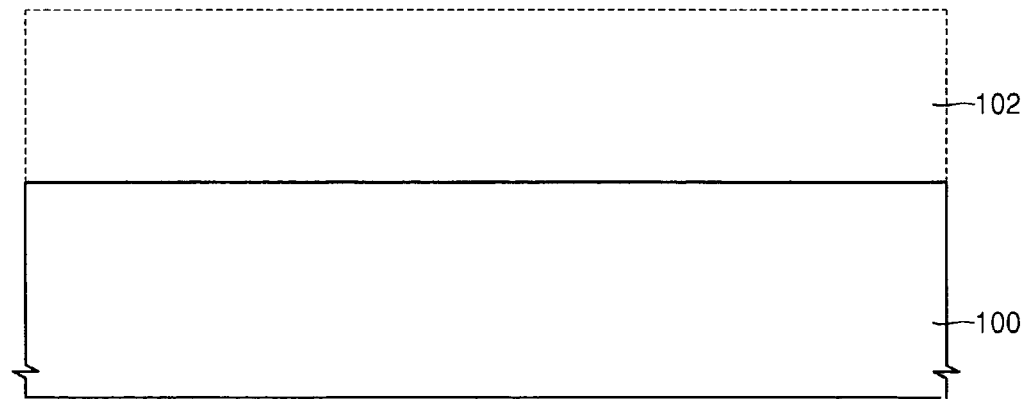

Referring to FIGS. 4A and 4B, a semiconductor substrate 100 formed of silicon is etched using an etch mask (not shown), thereby forming a plurality of gate trenches 102, which have a predetermined depth and extend in the direction y (refer to FIG. 2). Each of the gate trenches 102 is formed in the shape of a groove that extends in the direction y. In FIG. 4B, a region illustrated with a dotted line refers to the inside of one of the gate trenches 102. The etch process by which the gate trenches are formed may be performed using a photoresist pattern or a hard mask pattern (e.g., a silicon nitride layer) as the etch mask. After the etch mask is removed, the semiconductor substrate 100 may be further etched using a dry etch process using $O_2$ and $CF_4$ gas if necessary, thereby forming a smoother profile of the gate trench 102.

Figure 5A:
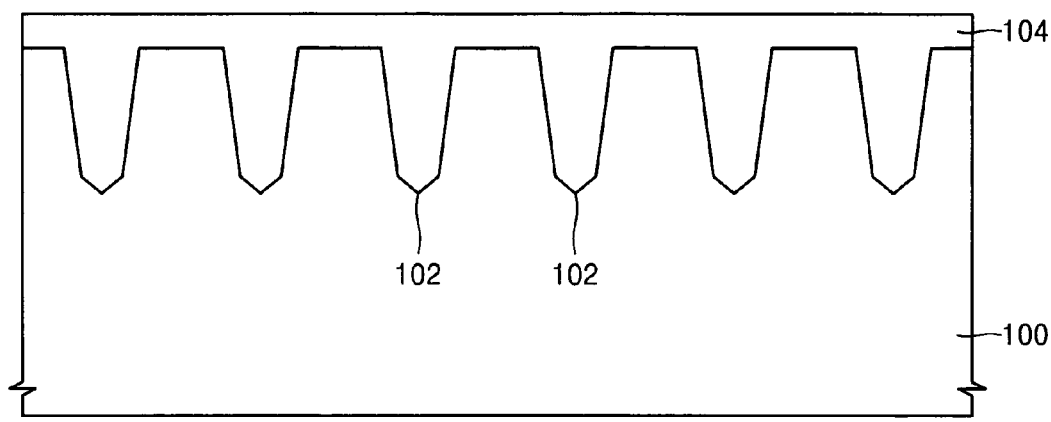
Figure 5B:
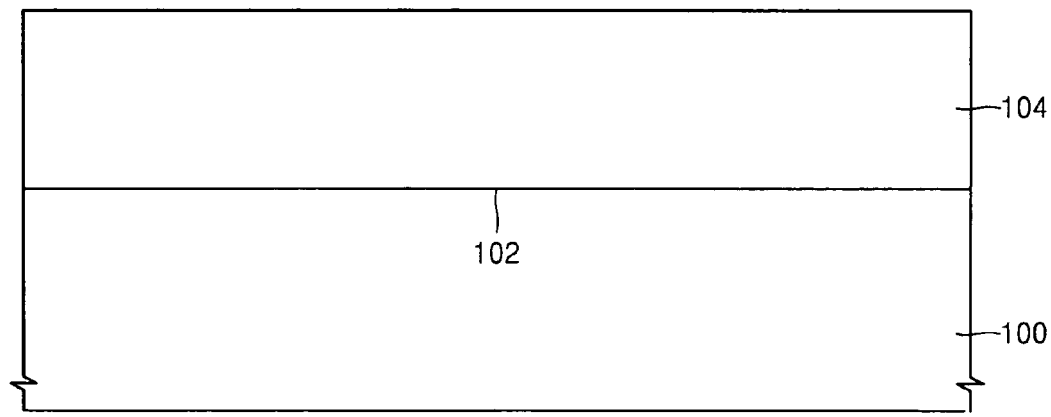

Referring to FIGS. 5A and 5B, the semiconductor substrate 100 is thermally oxidized to cure damage to the semiconductor substrate 100 caused by the etch process for forming the gate trenches 102. Next, a predetermined material is deposited on the entire surface of the semiconductor substrate 100 where the gate trenches 102 are formed. Thus, the gate trenches 102 are completely filled with the material and a first sacrificial layer 104 is formed to a predetermined thickness, which covers the top surface of the semiconductor substrate 100. The first sacrificial layer 104 may be formed of, for example, a silicon nitride layer. However, it should be appreciated that, in exemplary embodiments of the invention, the layer used as the first sacrificial layer 104 is not limited to a silicon nitride layer. That is, after an isolation layer is subsequently formed, the first sacrificial layer 104 is removed using a predetermined etch gas or etchant. Therefore, any layer that has a high etch selectivity with respect to the isolation layer formed of oxide can be used as the first sacrificial layer 104. Preferably, the first sacrificial layer 104 has a planar surface that facilitates a subsequent photography process.

Figure 6A:
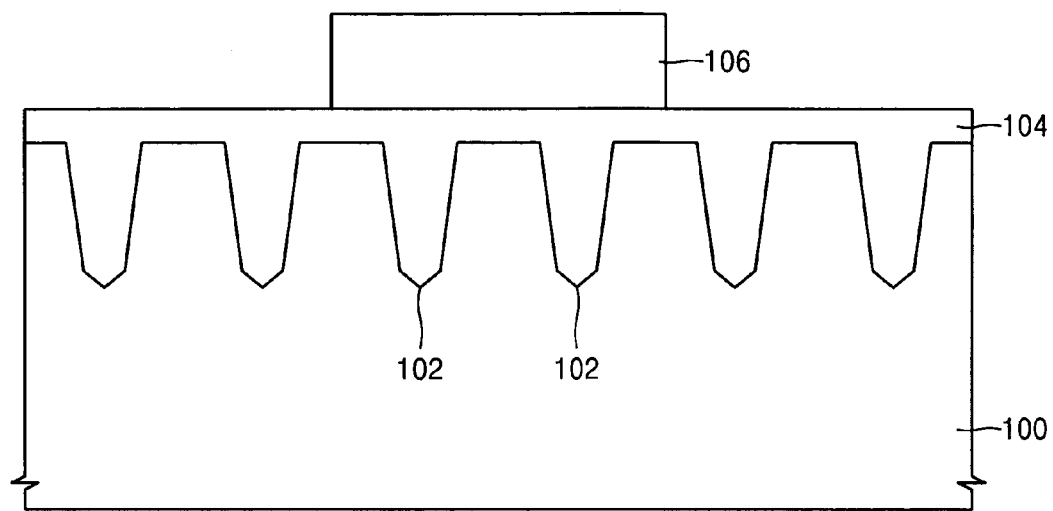
Figure 6B:
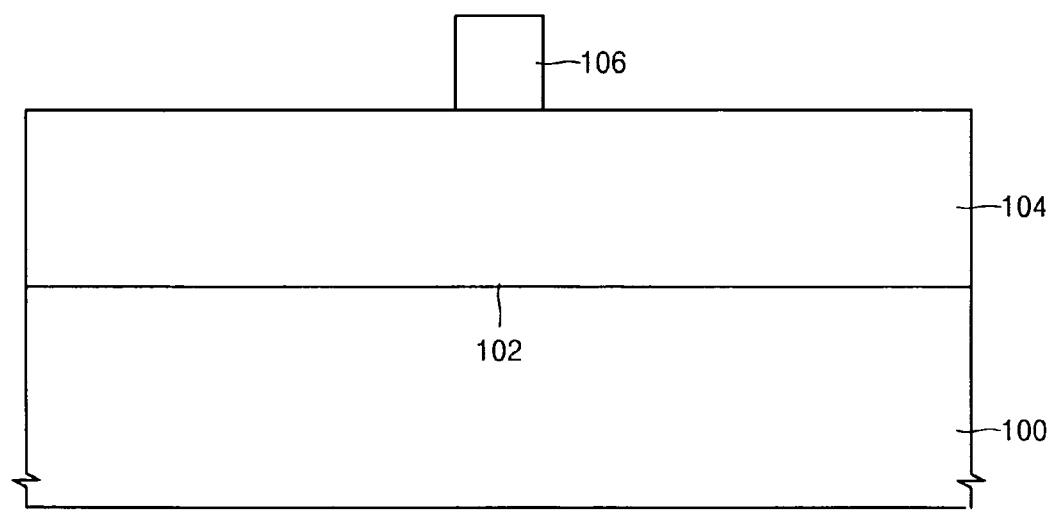

Referring to FIGS. 6A and 6B, to define active regions 112 in the semiconductor substrate 100, a mask pattern 106 is formed on the first sacrificial layer 104 using a photography process such that the active regions 112 are covered. The mask pattern 106 may be, for example, a photoresist pattern or a hard mask pattern such as a silicon oxide layer.

Figure 7A:
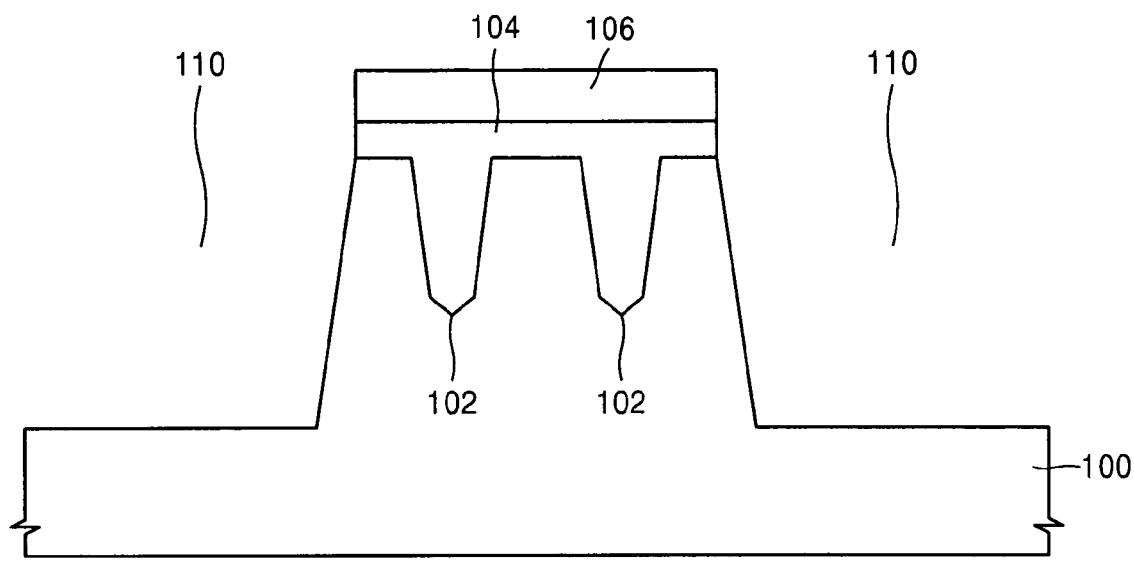
Figure 7B:
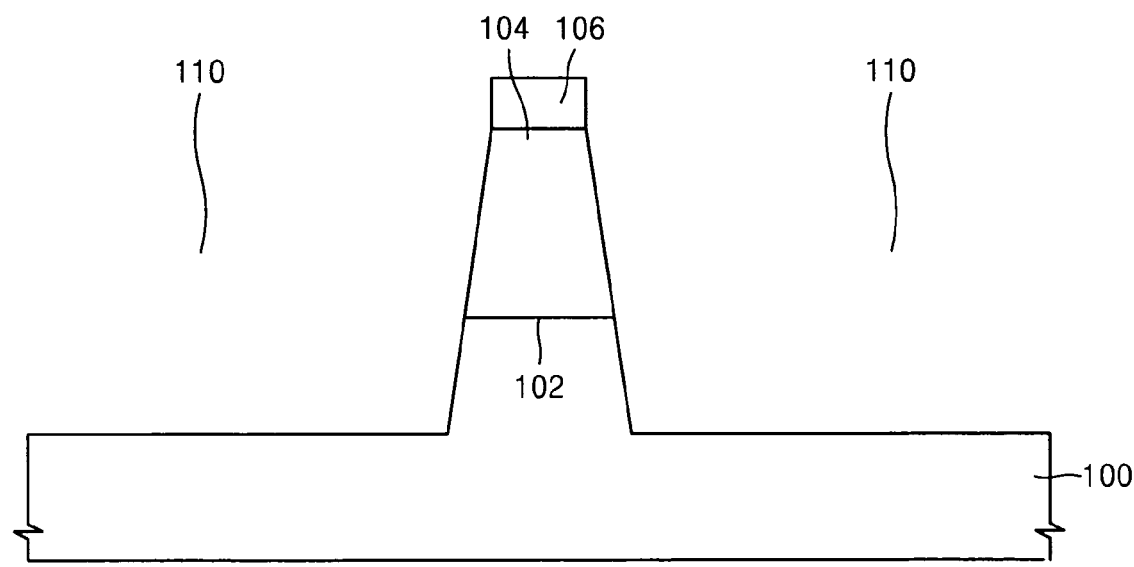

Referring to FIGS. 7A and 7B, the first sacrificial layer 104 and the semiconductor substrate 100 are anisotropically etched by using the mask pattern 106 as an etch mask. Thus, isolation trenches 110 are formed in the semiconductor substrate 100. A plurality of active regions 112, which extend in the direction x (refer to FIG. 2), are defined by the isolation trenches 110. The isolation trenches 110 are deeper than the gate trenches 102.

After the isolation trenches 110 are formed, the first sacrificial layer 104 remains only in the active regions 1 12 on the semiconductor substrate 100. Referring to FIG. 7B, first sidewalls of the first sacrificial layer 104 are exposed by the isolation trenches 110 because the first sacrificial layer 104 only fills the gate trenches 102 in the active regions 112. On the other hand, referring to FIG. 7A, the first sacrificial layer 104 is not exposed by the inner sidewalls of the isolation trenches 110.

The first sacrificial layer 104 and the semiconductor substrate 100 are etched simultaneously by a single etch process using a first etch gas that causes a very low etch selectivity of the first sacrificial layer 104 with respect to the semiconductor substrate 100. Preferably, the etch selectivity of the first sacrificial layer 104 with respect to the semiconductor substrate 100 is about 1:3 to 3:1. For example, if the semiconductor substrate 100 is formed of silicon and the first sacrificial layer 104 is formed of silicon nitride, a gaseous mixture of $CF_4$ and $CHF_3$ may serve as the first etch gas. The first etch gas may further contain at least one of $Cl_2$ and HBr, if necessary.

Figure 8A:
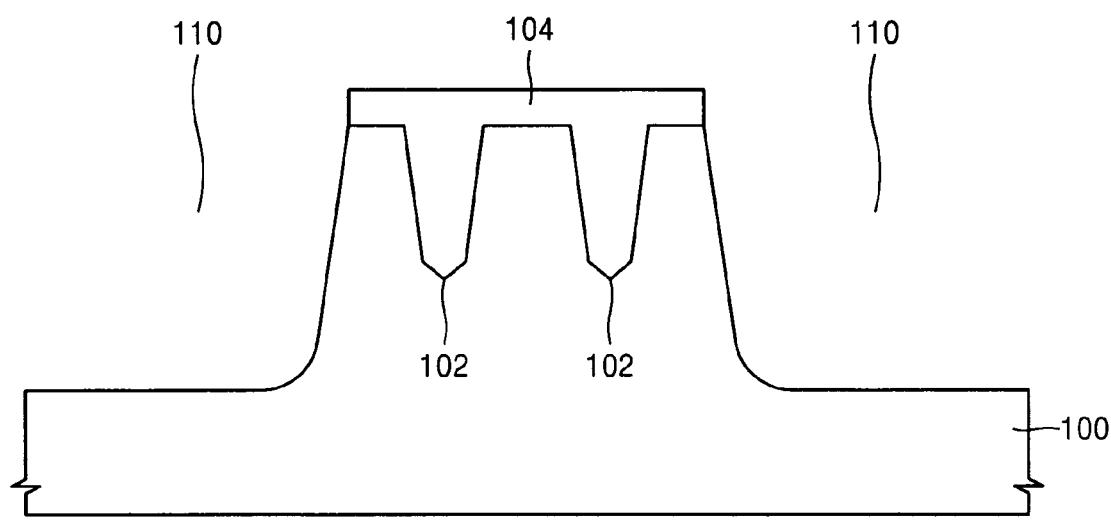
Figure 8B:
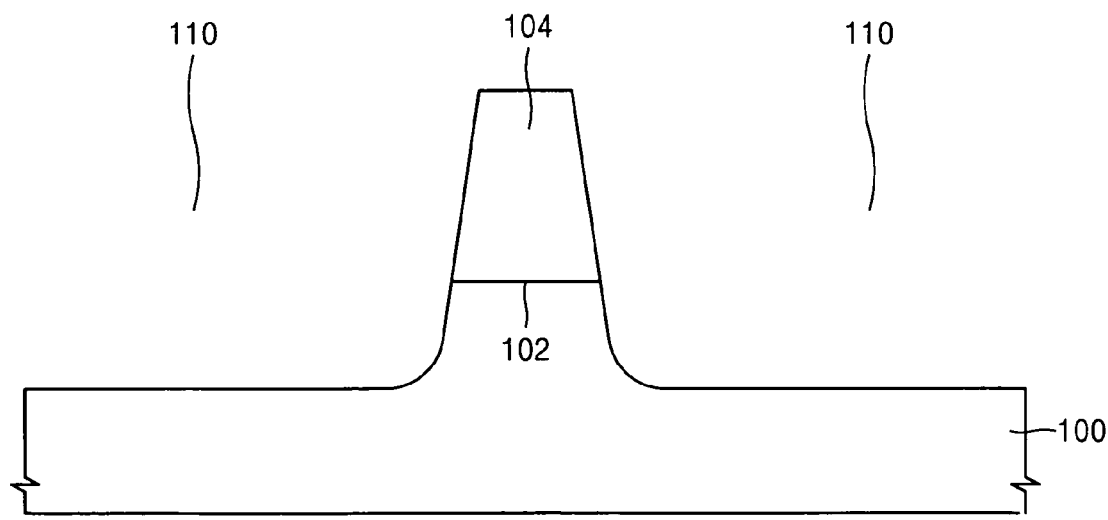

Referring to FIGS. 8A and 8B, the mask pattern 106 is removed. Thereafter, exposed portions of the semiconductor substrate 100 within the isolation trenches 110 may be further etched if necessary so as to form rounded corners in the bottoms of the isolation trenches 110. Here, a second etch gas containing a gaseous mixture of $Cl_2$ and HBr may be used.

Figure 9A:
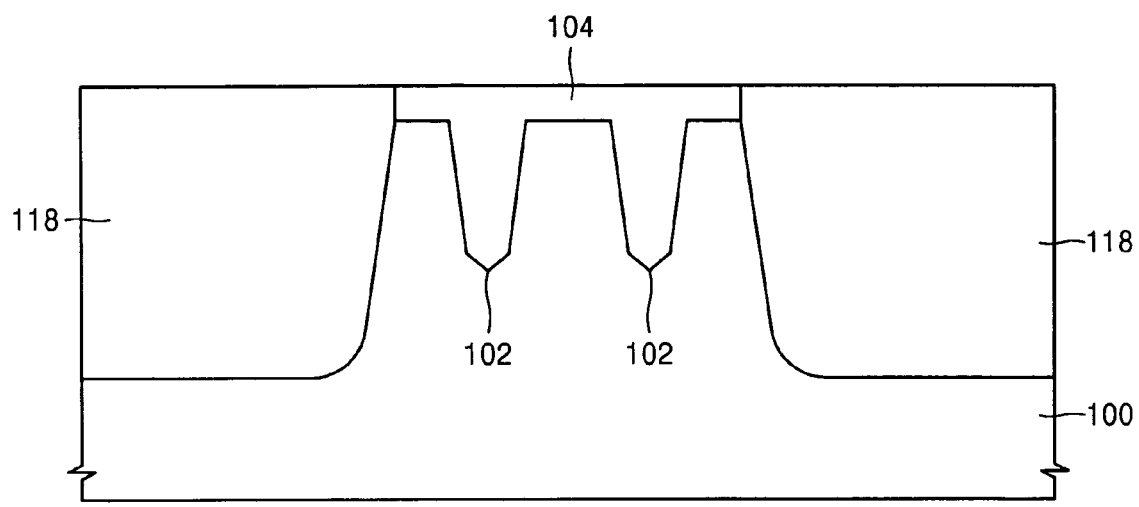
Figure 9B:
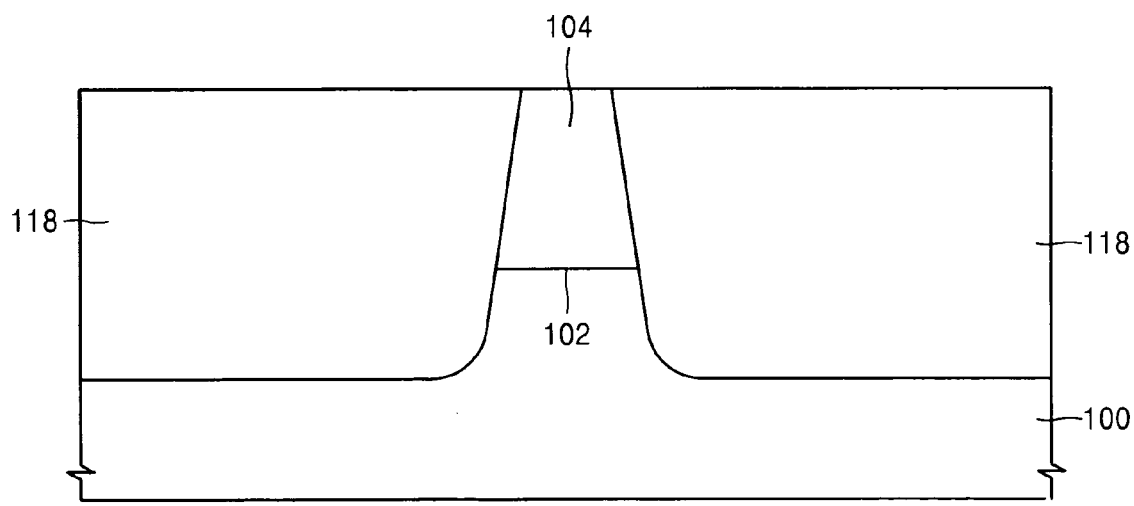

Referring to FIGS. 9A and 9B, the isolation trenches 110 are filled with an insulating material, which is then planarized using chemical mechanical polishing (CMP). Thus, isolation layers 118 are formed that define the active regions 112. The isolation layers 118 are formed of oxide layers. When the isolation layers 118 are formed, a silicon nitride liner (not shown) may be formed adjacent to the inner walls of the isolation trenches 110.

Figure 10A:
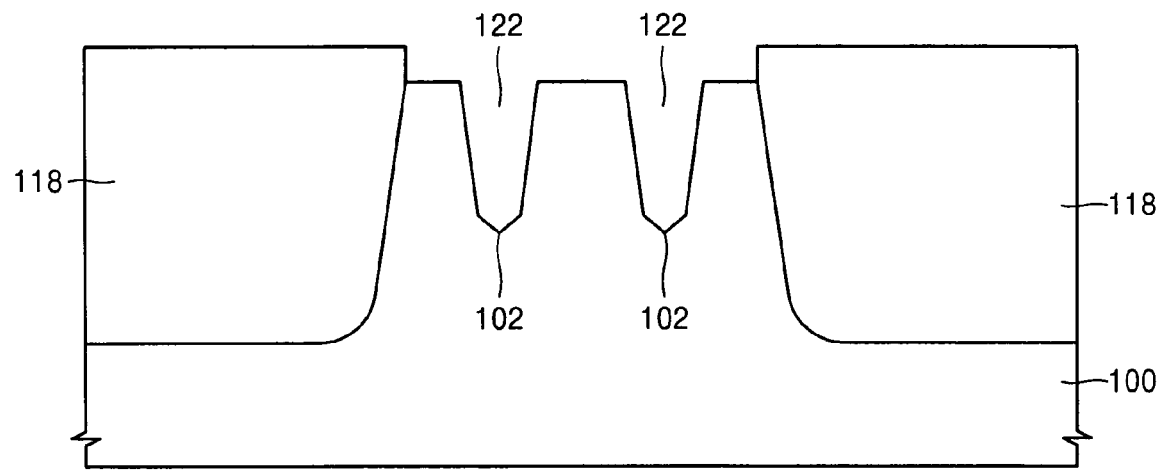
Figure 10B:
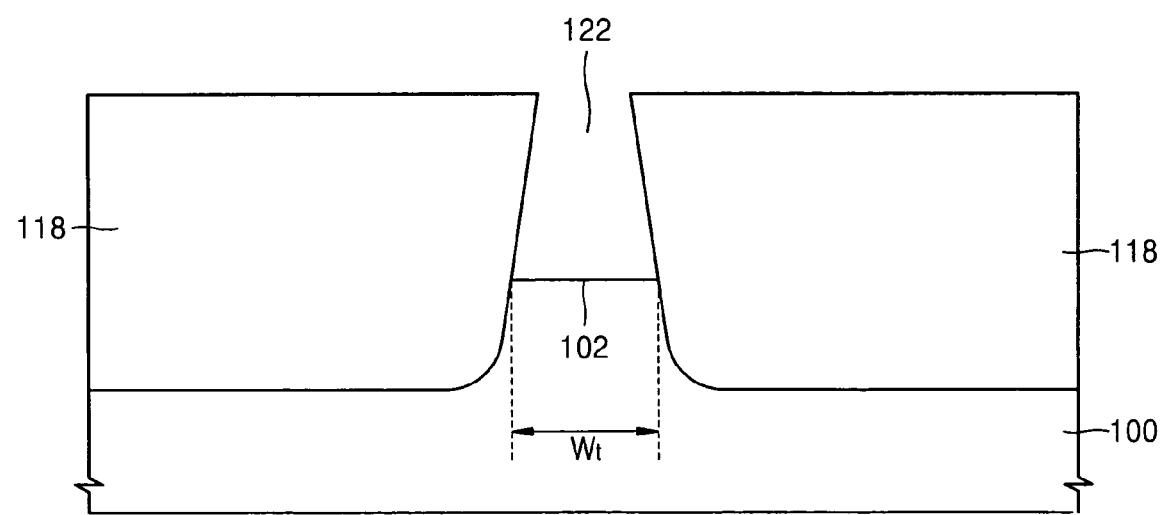

Referring to FIGS. 10A and 10B, the first sacrificial layer 104, disposed in the gate trenches 102, is completely removed from the active region 112, thereby exposing gate regions 122, which are defined by the gate trenches 102. The first sacrificial layer 104 can be removed using, for example, a phosphoric acid wet etch process.

Referring to FIG. 10B, the width Wt of the gate trenches 102, which are exposed to the isolation layers 118 and constitute the gate regions 122, are greatest at their bottoms.

Figure 11A:
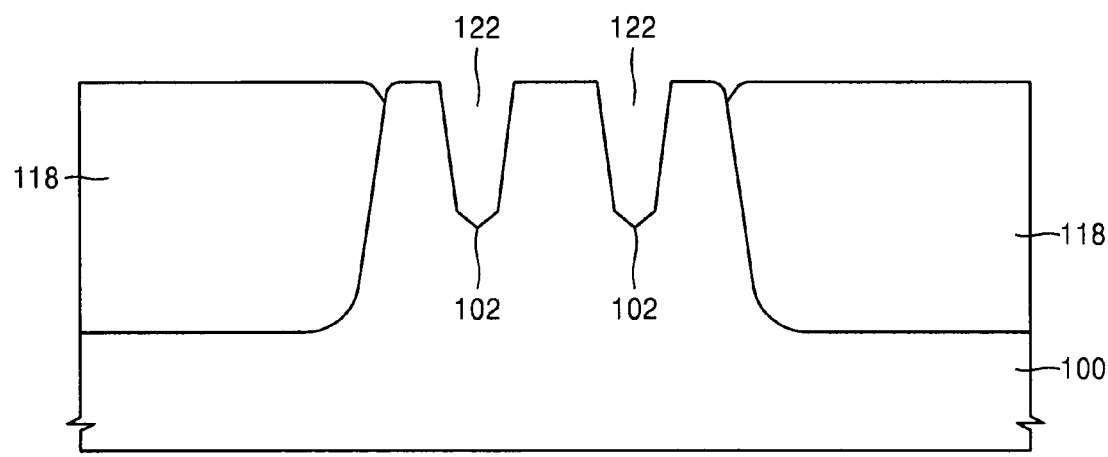
Figure 11B:
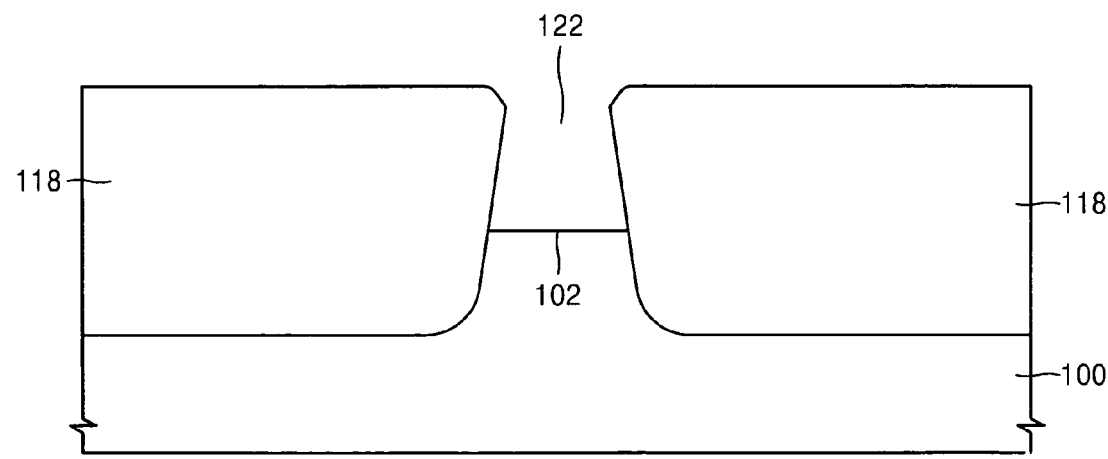

Referring to FIGS. 11A and 11B, the isolation layers 118 are partially removed using a wet etch process such that the top surface of the semiconductor substrate 100 that is exposed through the isolation layers 118 forms a planar surface with the isolation layers 118.

Figure 12A:
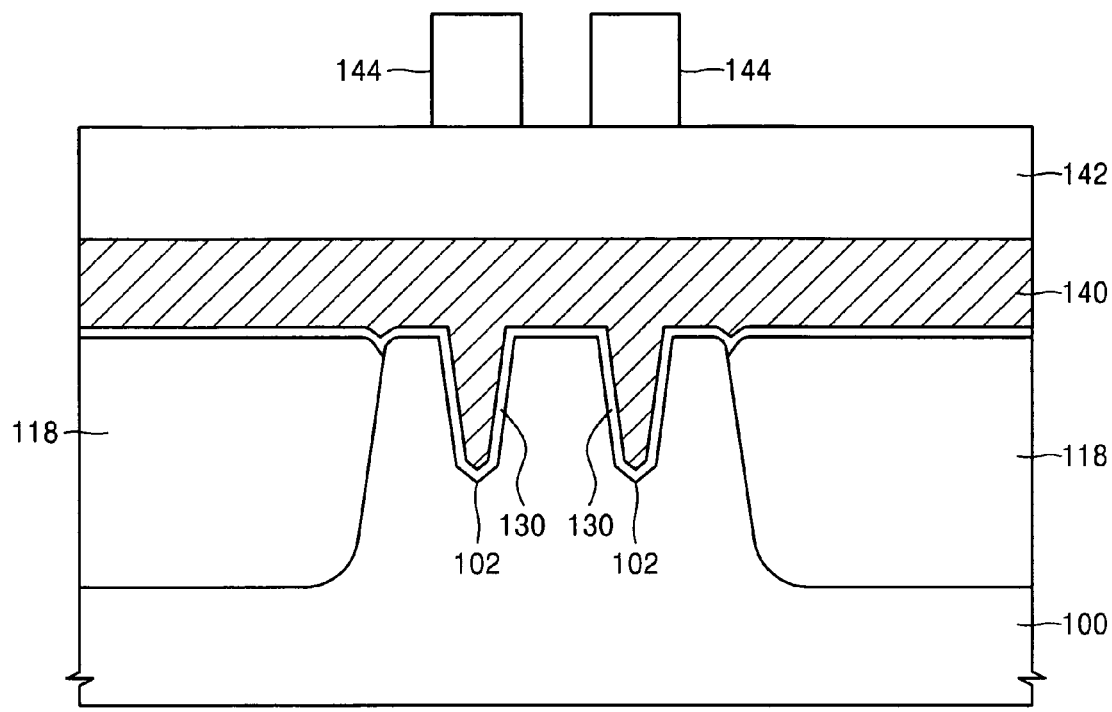
Figure 12B:
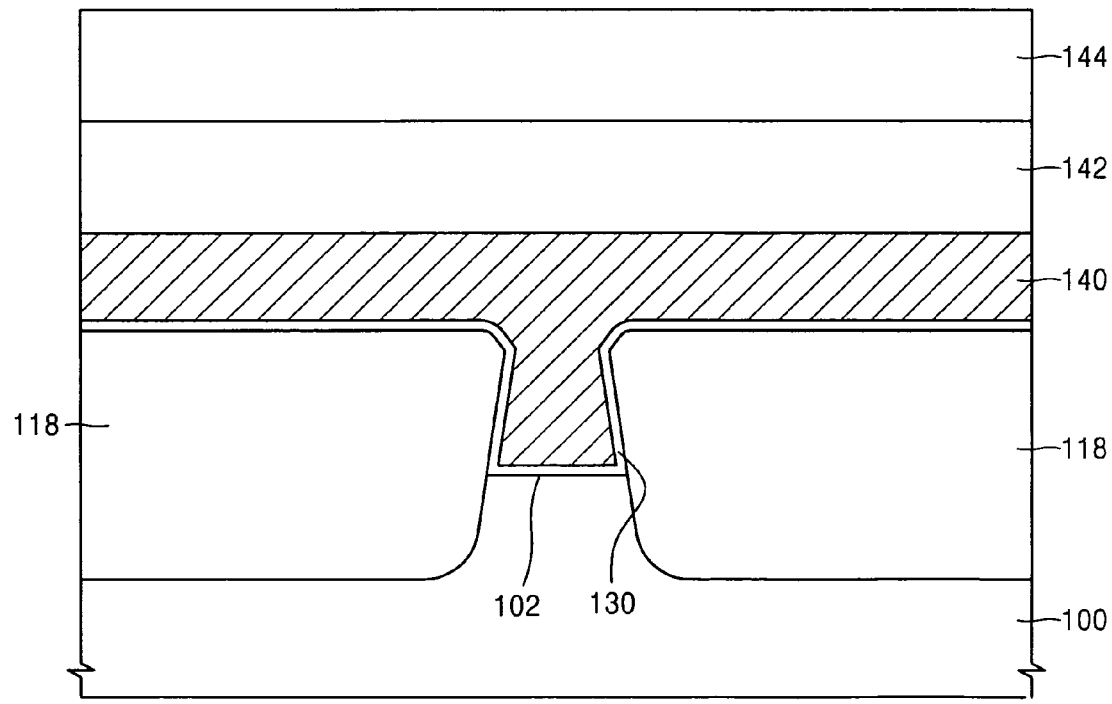

Referring to FIGS. 12A and 12B, a gate insulating layer 130 is formed on the inner walls of the gate trenches 102, which constitute the gate regions 122, in the active regions 112, and then a conductive layer 140 is formed on the gate insulating layer 130 to form gate electrodes. The conductive layer 140 may be, for example, a single conductive polysilicon layer or a double layer including a conductive polysilicon layer and a metal silicide layer, which are sequentially stacked.

An insulating layer 142 is formed on the conductive layer 140, and a photoresist pattern 144 is formed on the insulating layer 142 and covers the gate regions 122. The insulating layer 142 is preferably a silicon nitride layer, and functions as both a hard mask and a capping layer that protects gate electrodes, in a subsequent patterning process for forming the gate electrodes.

Figure 13A:
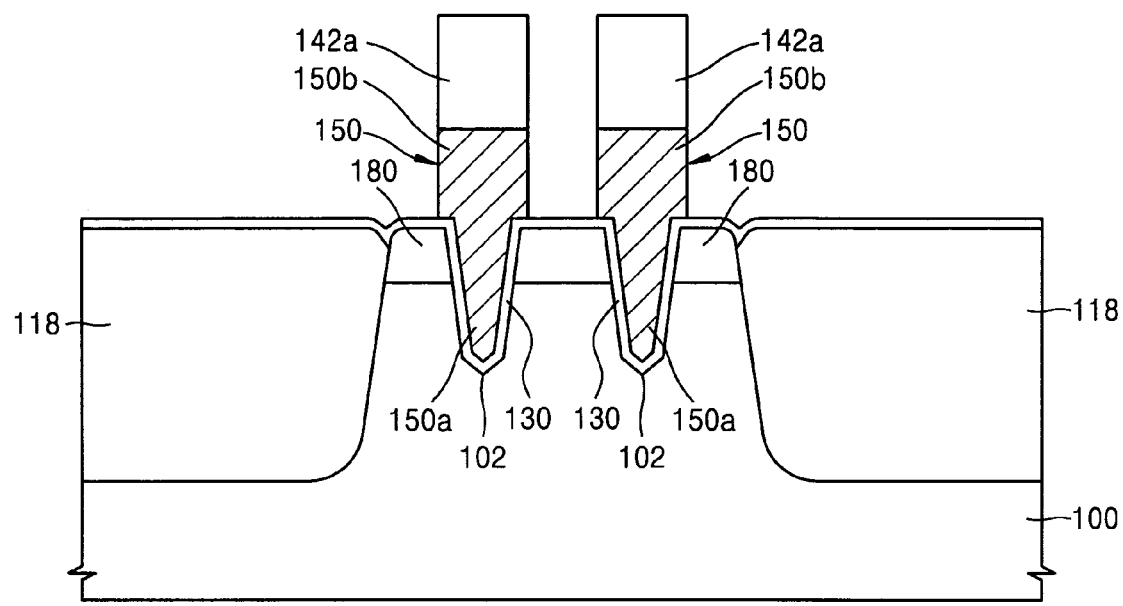
Figure 13B:
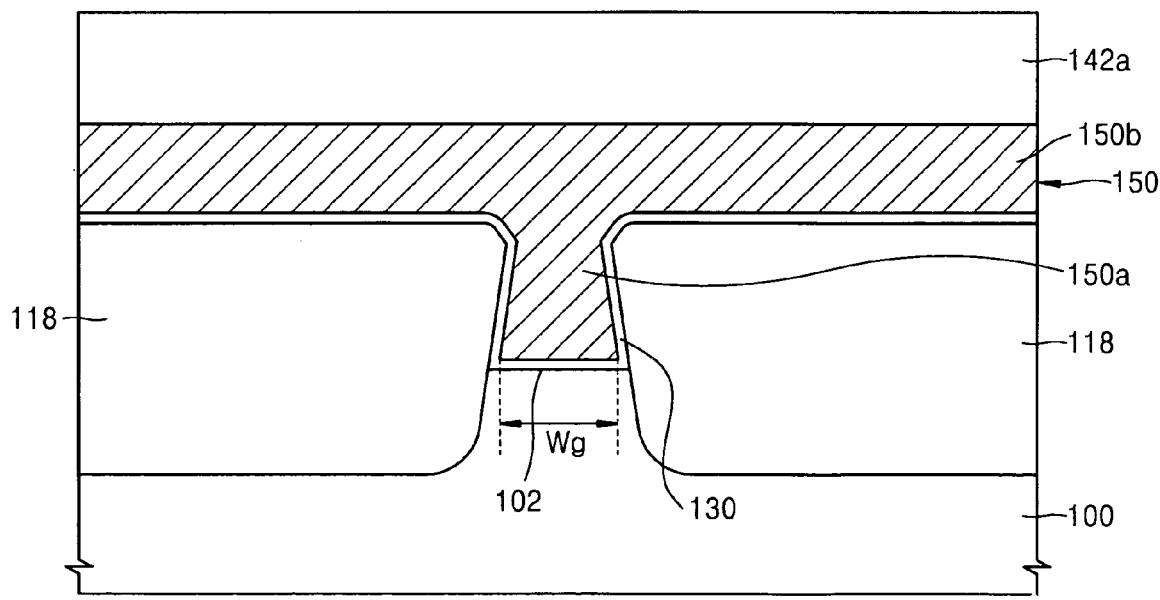

Referring to FIGS. 13A and 13B, the insulating layer 142 is etched using the photoresist pattern 144 as an etch mask, thereby forming an insulating pattern 142a. Thereafter, the conductive layer 140 is etched using the insulating pattern 142a as an etch mask, thereby forming gate electrodes 150. As described with reference to FIGS. 3A and 3B, each of the gate electrodes 150 includes a bottom gate portion 150a, which fills the gate trench 120 recessed in the semiconductor substrate 100, and a top gate portion 150b, which is disposed on the semiconductor substrate 100 and extends in the direction y perpendicular to the active region 112. Also, the width of the bottom gate portion 150a of the gate electrode 150, which is measured in the direction y in which the gate electrode 150 extends, is defined by the isolation layer 118. Also, as shown in FIG. 3B, the width Wg of the bottom gate portion 150a is greatest at its bottom.

Thereafter, source/drain regions 180 are formed by implanting impurity ions into the semiconductor substrate 100. An insulating layer is deposited and then etched back, thereby forming spacers 160 on sidewalls of the gate electrodes 150. Thus, the structure shown in FIGS. 3A and 3B is obtained.

FIGS. 14A and 14B through 21A and 21B are cross-sectional views illustrating a method of manufacturing a semiconductor device according to another embodiment of the present invention. Here, FIGS. 14A, 15A, . . . , and 21A are sectional views corresponding to the section taken along line IIIa–IIIa' of FIG. 2, and FIGS. 14B, 15B, . . . , and 21B are sectional views corresponding to the section taken along line IIIb–IIIb' of FIG. 2. In the present embodiment, to facilitate understanding, the same reference numerals are used to denote the same elements as in the previous embodiment, and a description thereof will not be repeated here.

In the present embodiment of the invention, a gate trench is formed in a semiconductor substrate and then an isolation trench is formed, similarly to the previous embodiment. However, the present embodiment provides a method of preventing a rough bottom surface of the isolation trench which may be generated due to a difference in etch rate between the first sacrificial layer 104 and the semiconductor substrate 100.

Figure 14A:
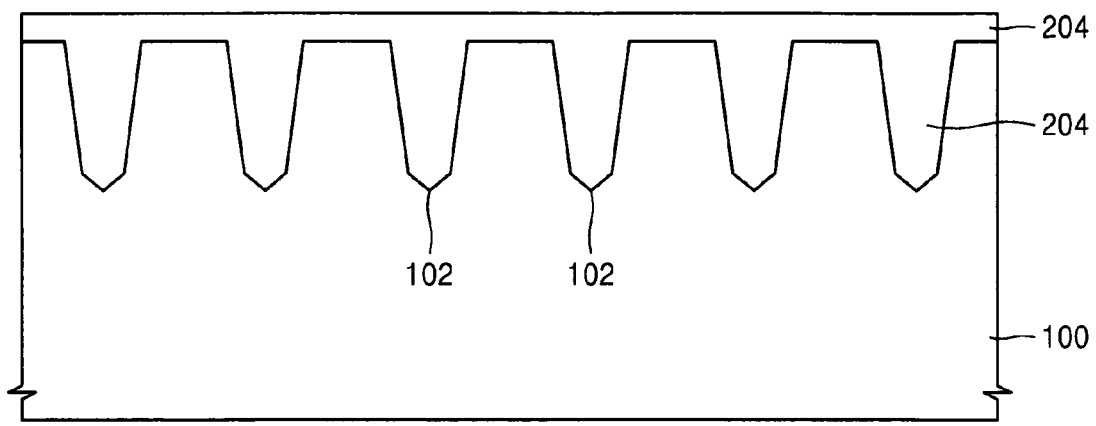
Figure 14B:
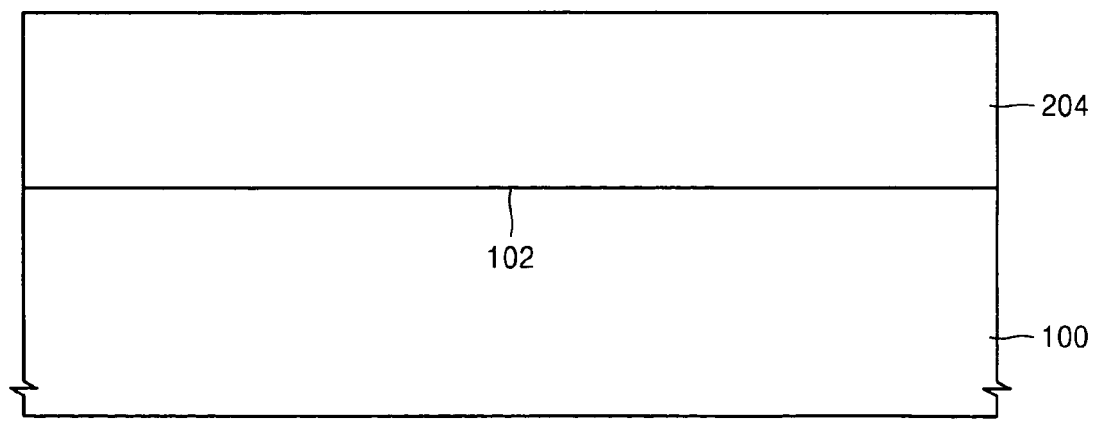

Referring to FIGS. 14A and 14B, a plurality of gate trenches 102 are formed in a semiconductor substrate 100, and a second sacrificial layer 204 is formed on the semiconductor substrate 100 to a sufficient thickness such that it fills the gate trenches 102. A material used as the second sacrificial layer 204 has the same dry etching characteristics as silicon (Si) of which the semiconductor substrate 100 is formed, but has a high etch selectivity with respect to Si, so that the second sacrificial layer 204 can be selectively removed by a wet etch process. Preferably, the second sacrificial layer 204 is formed of SiGe. In a dry etch process using an etch gas containing Br and Cl, a difference in dry etch rate between a SiGe layer and a Si layer is 20% or less (refer to JVST A 9(3), p768 (1991)). By adding an $H_2$ gas to the etch gas containing Br and Cl, a dry etch rate of the SiGe layer can be made equal to the dry etch rate of the Si layer.

Figure 15A:
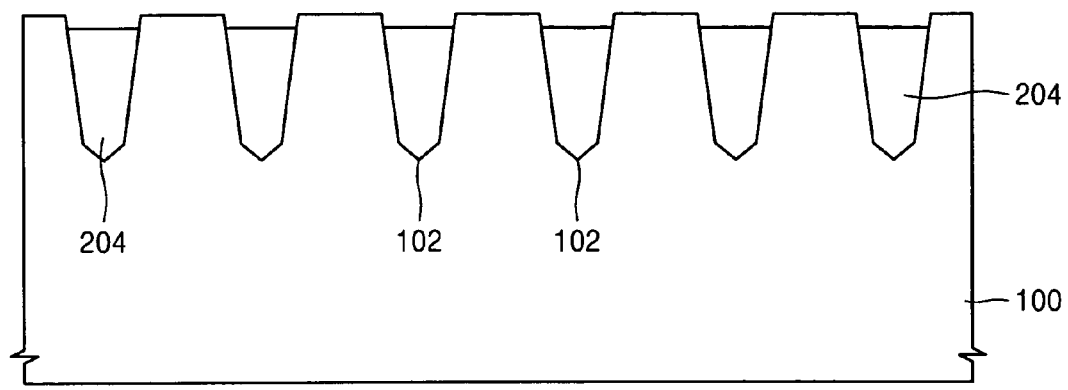
Figure 15B:
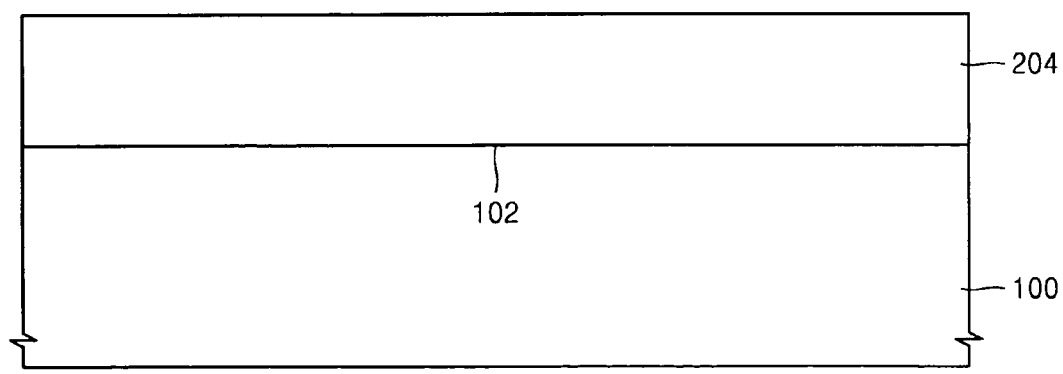

Referring to FIGS. 15A and 15B, a portion of the second sacrificial layer 204, which covers a top surface of the semiconductor substrate 100, is wet etched until the top surface of the semiconductor substrate 100 is exposed, such that the second sacrificial layer 204 remains only in the gate trenches 102. In this wet etch process, the second sacrificial layer 204 can be selectively removed using a first etchant that has a high etch selectivity of the second sacrificial layer 204 with respect to silicon (Si), which forms the semiconductor substrate 100. The first etchant may be, for example, $NH_4OH/H_2O_2/H_2O$, $HF/HNO_3/H_2O$, $HF/H_2O_2/H_2O$, or $HF/H_2O_2/CH_3COOH$. As illustrated with FIG. 15a, when the portion of the second sacrificial layer 204, which is disposed on the top surface of the semiconductor substrate 100, is wet etched, a top surface of the second sacrificial layer 204, which remains in each of the gate trenches 102, may be recessed a predetermined depth into the semiconductor substrate 100.

Figure 16A:
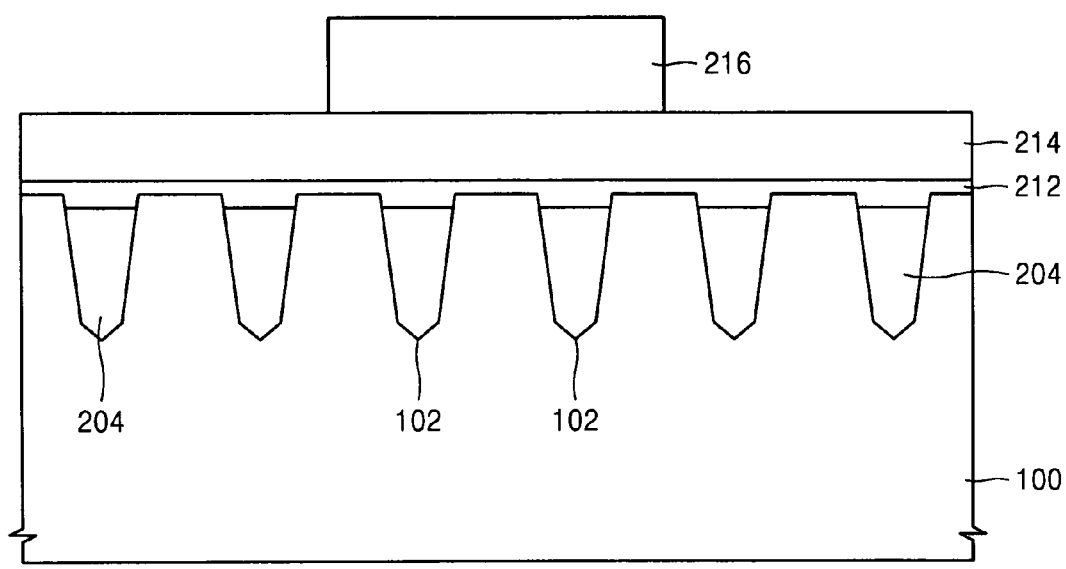
Figure 16B:
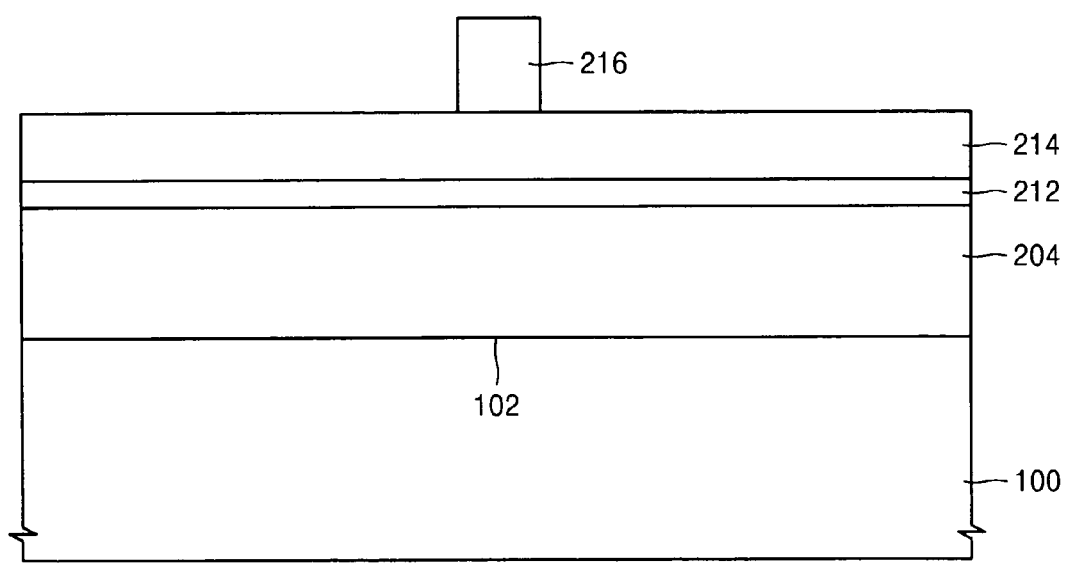

Referring to FIGS. 16A and 16B, a pad oxide layer 212 and a silicon nitride layer 214 are sequentially formed on the top surfaces of the semiconductor substrate 100 and the second sacrificial layer 204. Thereafter, a photoresist pattern 216 is formed on the silicon nitride layer 214 that covers active regions 112 (refer to FIG. 2) of the semiconductor substrate 100.

Figure 17A:
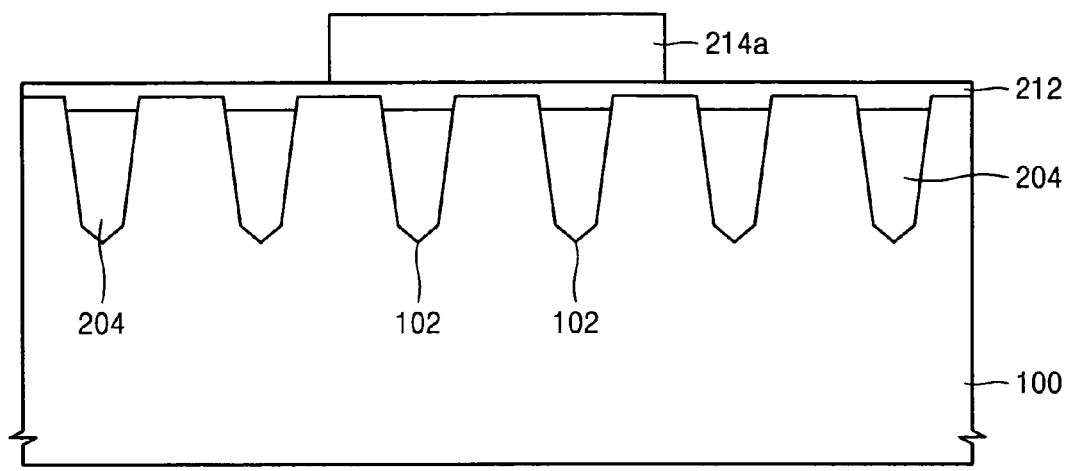
Figure 17B:
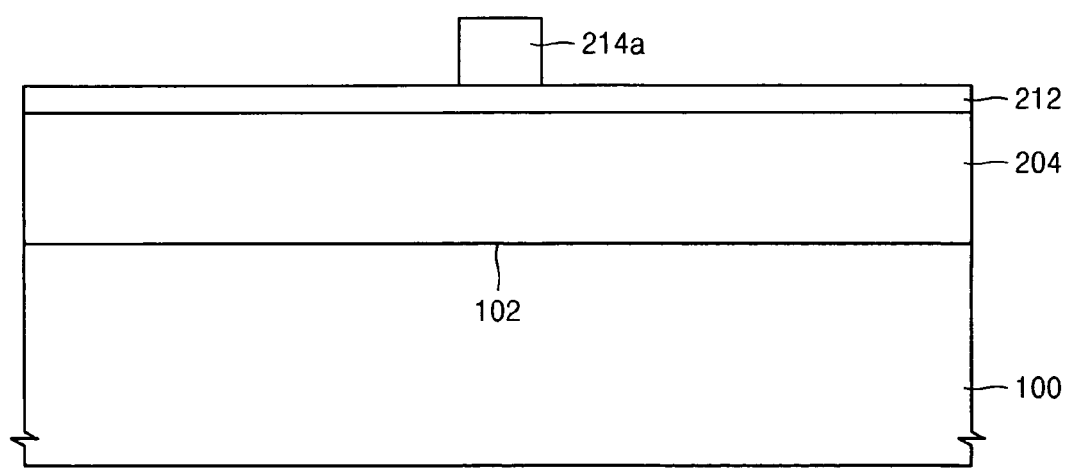

Referring to FIGS. 17A and 17B, the silicon nitride layer 214 is anisotropically etched using the photoresist pattern 216 as an etch mask, thereby forming a mask pattern 214a. The photoresist pattern 216 is then removed by ashing.

Figure 18A:
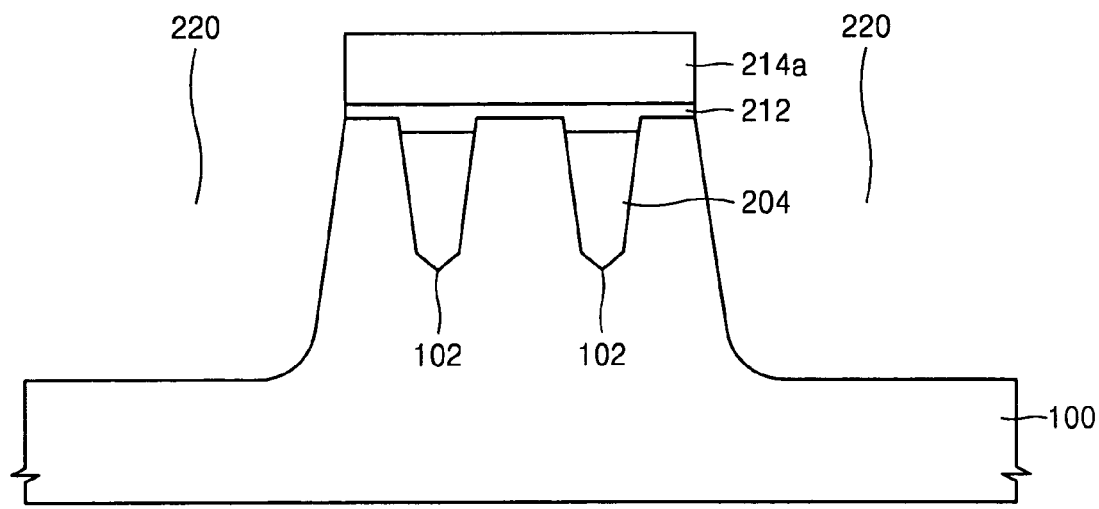
Figure 18B:
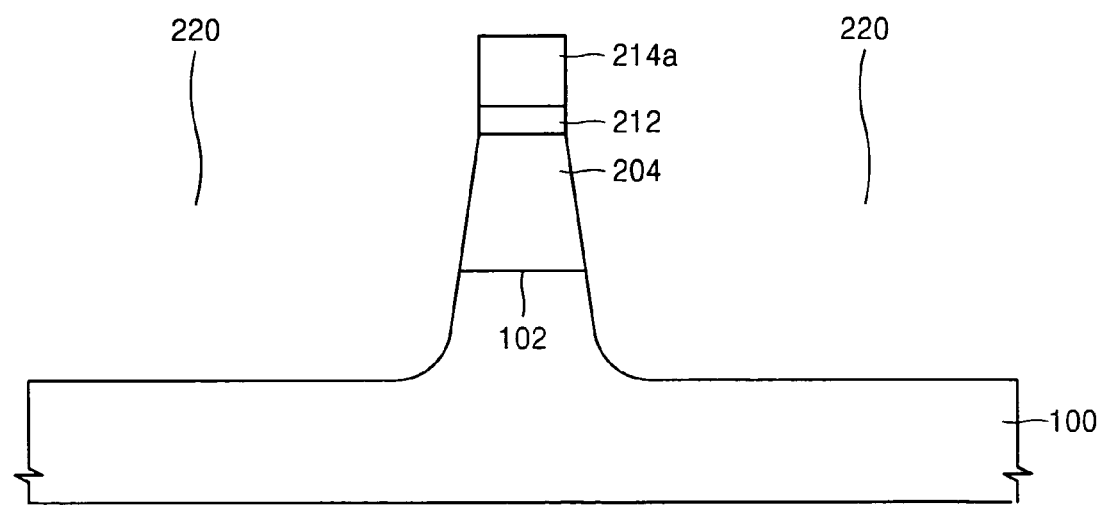

Referring to FIGS. 18A and 18B, the pad oxide layer 212 is removed using the mask pattern 214a as an etch mask until the semiconductor substrate 100 and the second sacrificial layer 204 are exposed. The resultant semiconductor substrate 100 and second sacrificial layer 204 are dry etched, thereby forming isolation trenches 220 in the semiconductor substrate 100. In the dry etch process, there is little difference between an etch rate of the second sacrificial layer 204 and an etch rate of the semiconductor substrate 100, such that the second sacrificial layer 204 filled in the gate trenches 102 is etched at almost the same etch rate as the semiconductor substrate 100 around the second sacrificial layer 204. Preferably, the dry etch process is performed using a gaseous mixture of $Cl_2$ and HBr as an etch gas, and an $H_2$ gas may be further included if necessary. Because there is little difference between the etch rate of the second sacrificial layer 204 and the etch rate of the semiconductor substrate 100, generation of a rough bottom surface of the isolation trenches 220 can be prevented.

A plurality of active regions 112, which extend in the direction x (refer to FIG. 2), are defined in the semiconductor substrate 100 by the isolation trenches 220. The isolation trenches 220 are deeper than the gate trenches 102.

After the isolation trenches 220 are formed, the second sacrificial layer 204 remains only in the active regions 112 on the semiconductor substrate 100. Also, as shown in FIG. 18B, first sidewalls of the second sacrificial layer 204 are exposed by the isolation trenches 220 because the second sacrificial layer 204 only fills the gate trenches 102 in the active regions 112. On the other hand, referring to FIG. 18A, second sidewalls of the second sacrificial layer 204 are not exposed by the isolation trenches 220.

Figure 19A:
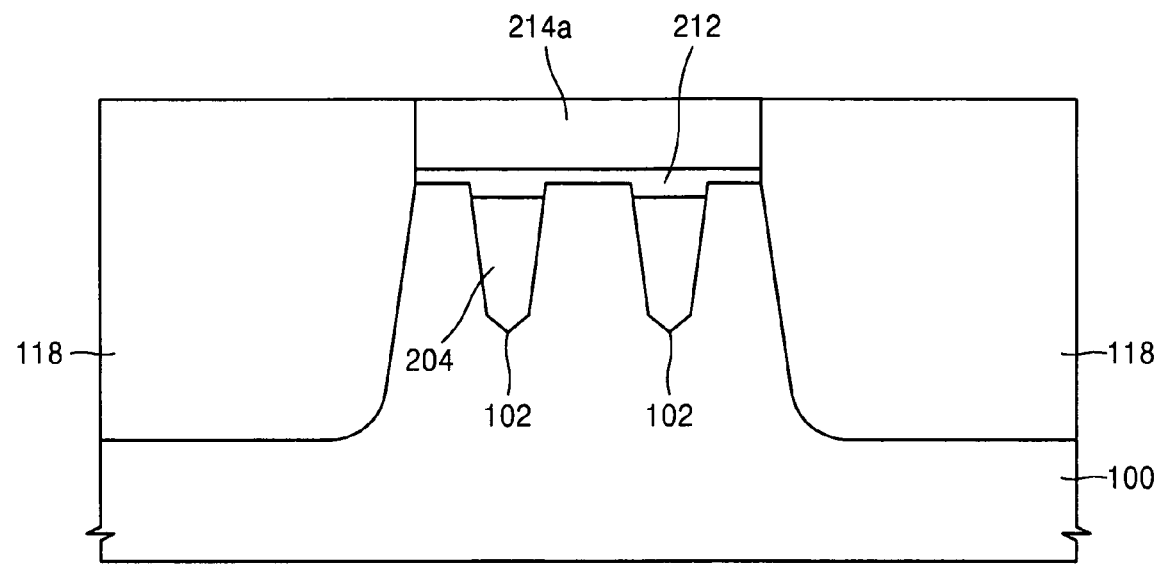
Figure 19B:
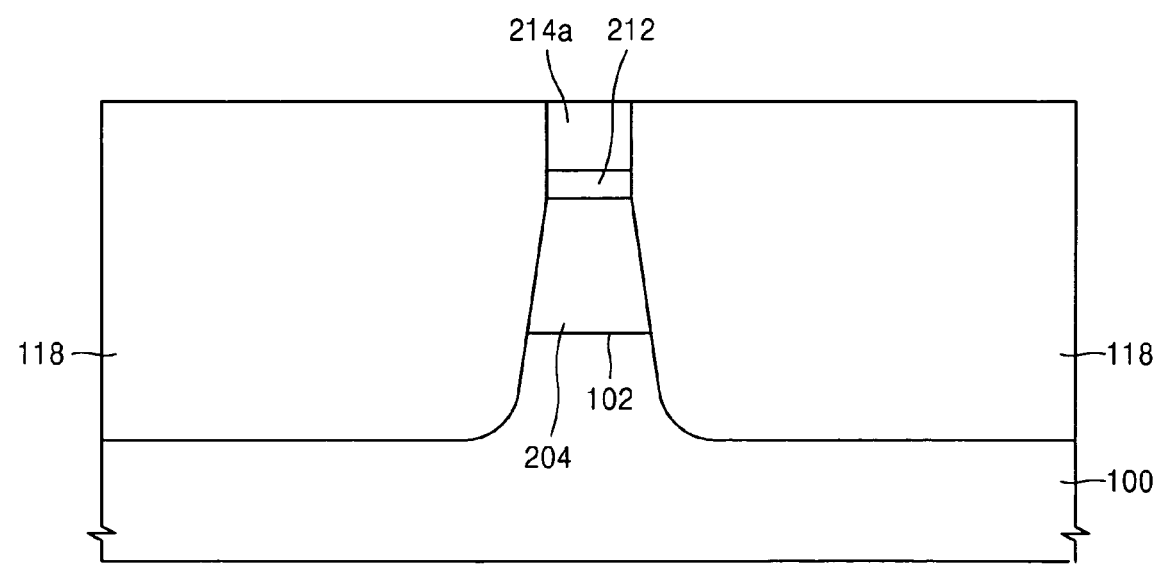

Referring to FIGS. 19A and 19B, the isolation trenches 220 are filled with an insulating material and then planarized using CMP, thereby forming isolation layers 118 that define the active regions 112. As described above, the insulating material used as the isolation layers 118 is preferably formed of an oxide layer, and a silicon nitride liner (not shown) may be formed adjacent to the inner walls of the isolation trenches 220 if necessary.

Figure 20A:
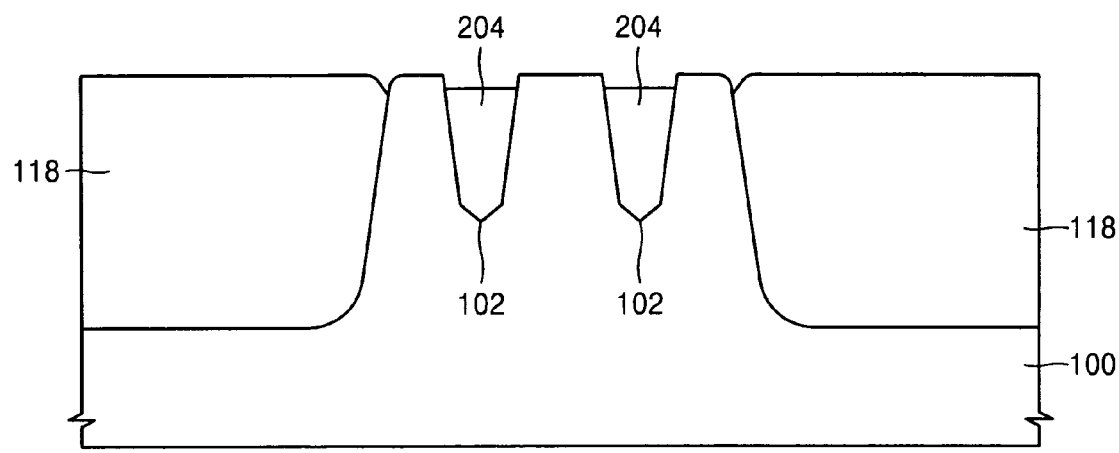
Figure 20B:
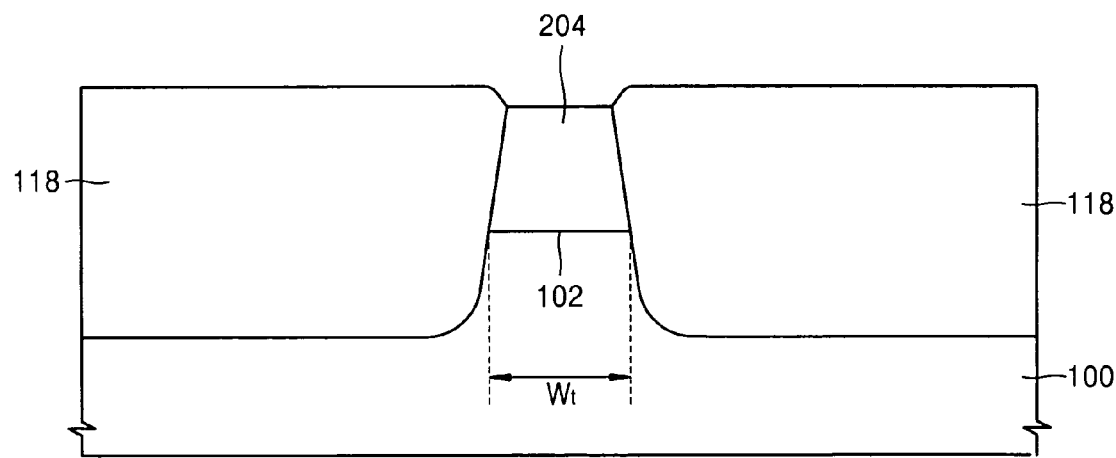

Referring to FIGS. 20A and 20B, the mask pattern 214a is completely removed using a phosphoric acid wet etch process such that the pad oxide layer 212 is exposed. The exposed pad oxide layer 212 is removed until the top surfaces of the semiconductor substrate 100 and the second sacrificial layer 204 are exposed. The isolation layers 118 are partially removed using a wet etch process such that the top surface of the semiconductor substrate 100 that is exposed through the isolation layers 118 forms a planar surface with the isolation layers 118. As shown in FIG. 20B, the width Wt of the gate trenches 102 is greatest at their bottoms.

Figure 21A:
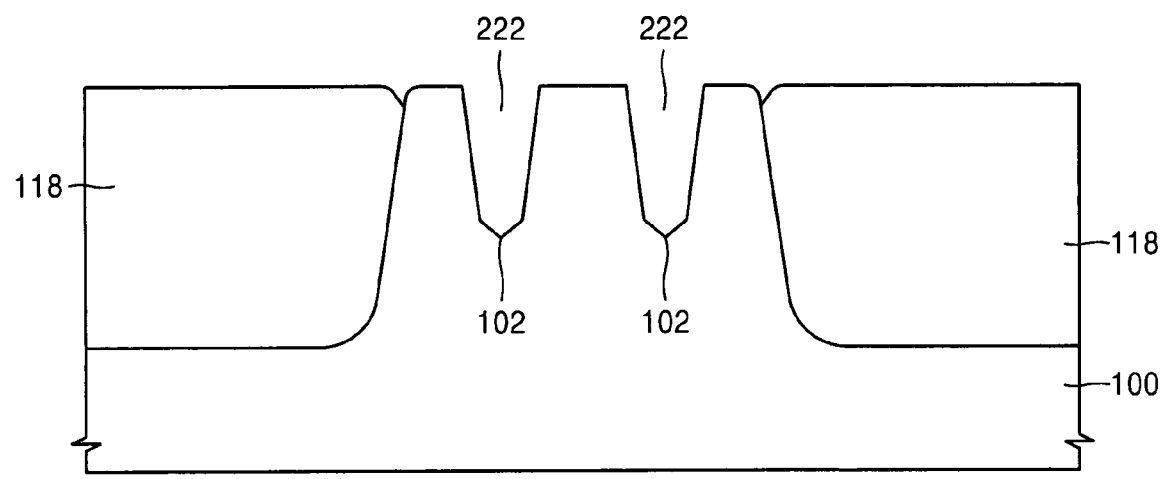
Figure 21B:
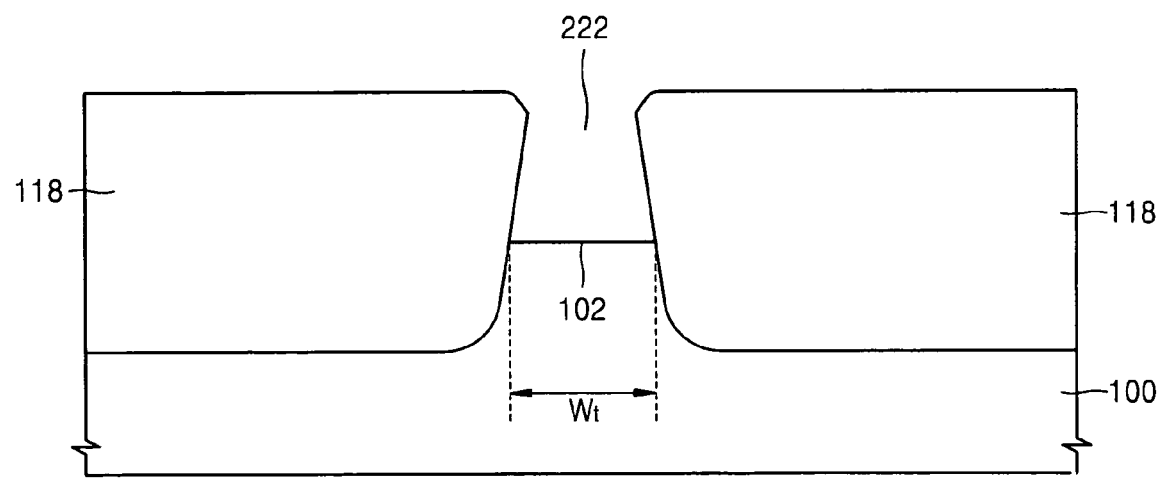

Referring to FIGS. 21A and 21B, the second sacrificial layer 204, disposed in the gate trenches 102, is completely removed from the active region 112, thereby exposing gate regions 222, which are defined by the gate trenches 102. The second sacrificial layer 204 can be removed by a wet etch process that results in a high etch selectivity of the second sacrificial layer 204 with respect to the semiconductor substrate 100. For example, if the second sacrificial layer 204 is formed of SiGe, the second sacrificial layer 204 is wet etched using a second etchant that results in a high etch selectivity of SiGe with respect to silicon, which forms the semiconductor substrate 100. The second etchant may be, for example, $NH_4OH/H_2O_2/H_2O$, $HF/HNO_3/H_2O$, $HF/H_2O_2/H_2O$, or $HF/H_2O_2/CH_3COOH$.

Thereafter, as described above with reference to FIGS. 12A, 12B, 13A, and 13B, subsequent transistor manufacturing processes are completed.

Figure 22:
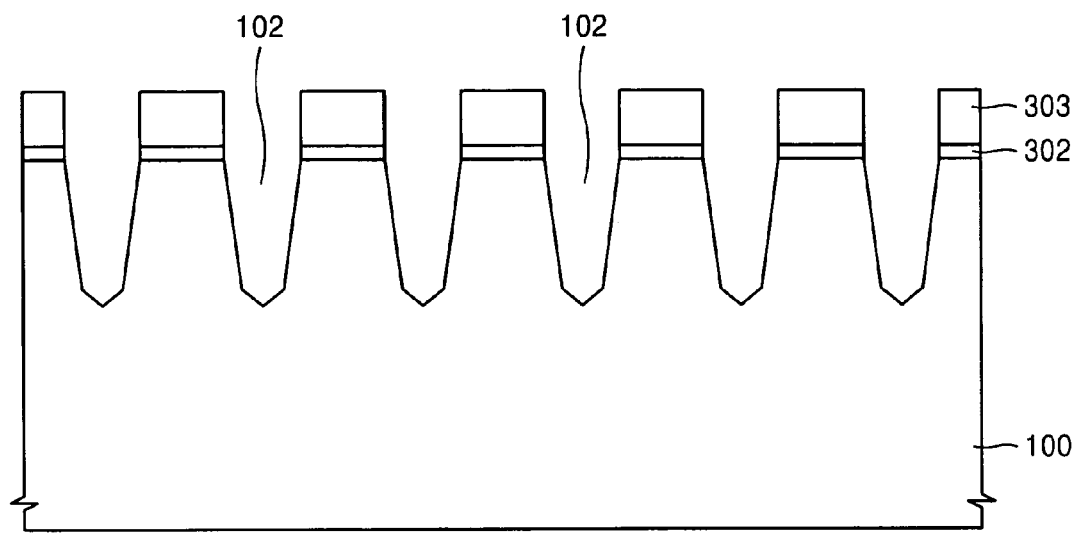
FIGS. 22 through 24 are sectional views illustrating a method of manufacturing a semiconductor device according to yet another embodiment of the present invention.
Figure 23:
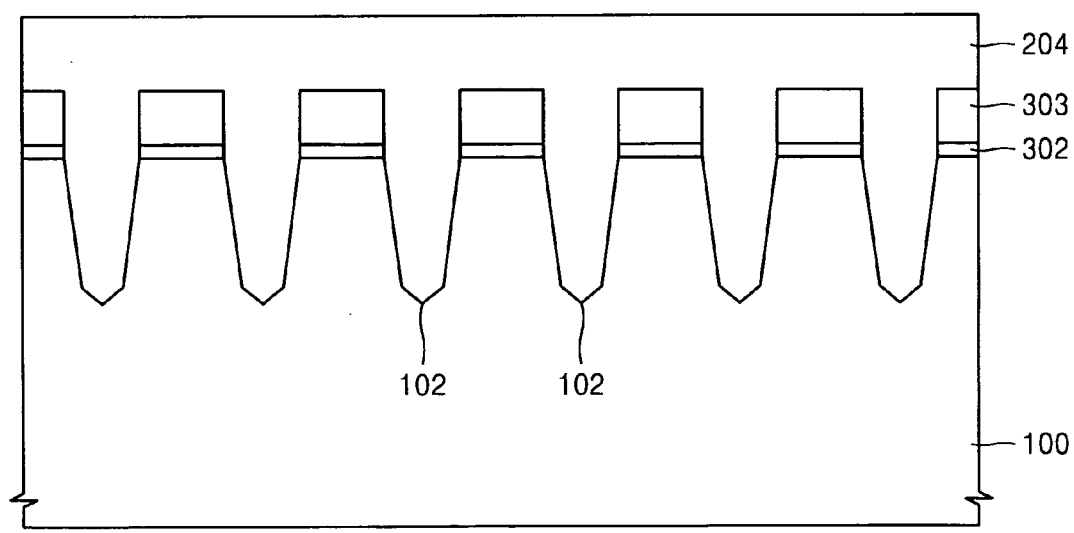
Figure 24:
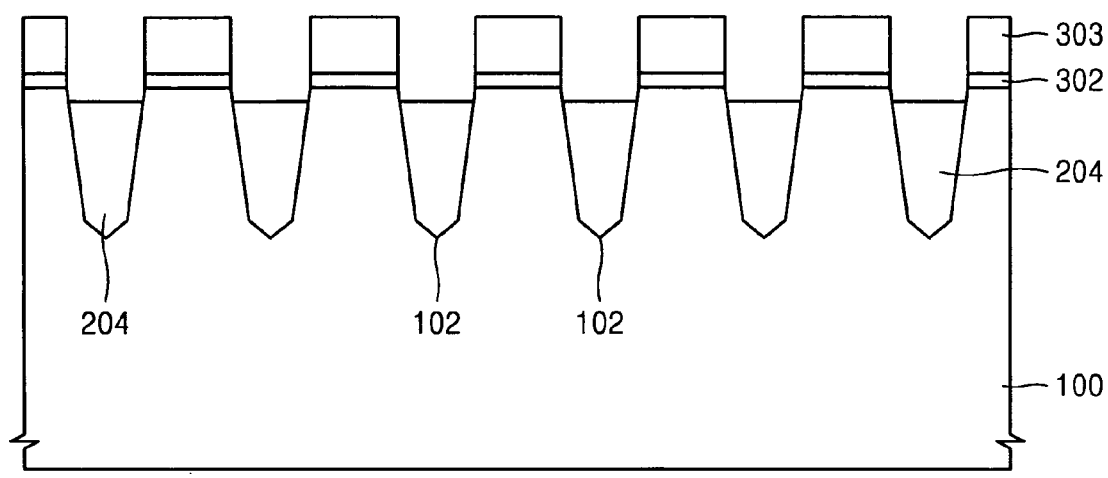

FIGS. 22 through 24 are sectional views illustrating a method of manufacturing a semiconductor device according to yet another embodiment of the present invention. Here, FIGS. 22 through 24 are sectional views corresponding to the section taken along line IIIa–IIIa' of FIG. 2. In the present embodiment, to facilitate understanding, the same reference numerals are used to denote the same elements as used in the previous embodiments, and a description thereof will not be repeated here.

In the present embodiment of the invention, a gate trench is formed in a semiconductor substrate and then an isolation trench is formed, similarly to the previous embodiments. Also, when the portion of the second sacrificial layer 204, which is disposed on the semiconductor substrate 100, is removed such that the second sacrificial layer 204 remains only in the gate trenches 102 as described above with reference to FIGS. 15A and 15B, both a CMP process and a wet etch process are used. This will be described in more detail later.

Referring to FIG. 22, a plurality of gate trenches 102 is formed in a semiconductor substrate 100 using a mask pattern that is formed of a pad oxide layer 302 and a silicon nitride layer 303.

Referring to FIG. 23, a second sacrificial layer 204 is formed on the semiconductor substrate 100, on which the pad oxide layer 302 and the second sacrificial layer 204 are still disposed, to a sufficient thickness such that the second sacrificial layer 204 fills the gate trenches 102. The second sacrificial layer 204 is preferably formed of SiGe.

Referring to FIG. 24, the second sacrificial layer 204 is polished using CMP until the top surface of the silicon nitride layer 303 is exposed. Thus, a portion of the second sacrificial layer 204 that covers the silicon nitride layer 303 is removed.

Thereafter, the second sacrificial layer 204 is selectively removed by a wet etch process using a first etchant which results in a high etch selectivity of the second sacrificial layer 204 with respect to silicon (Si), which forms the semiconductor substrate 100, such that the second sacrificial layer 204 remains only within the gate trenches 102. Here, the first etchant may be, for example, $NH_4OH/H_2O_2/H_2O$, $HF/HNO_3/H_2O$, $HF/H_2O_2/H_2O$, or $HF/H_2O_2/CH_3COOH$. The etched amount of the second sacrificial layer 204 can be controlled such that the top surface of the second sacrificial layer 204 that remains in the gate trench 102 is in the same plane as or slightly lower than the top surface of the semiconductor substrate 100.

Thereafter, the silicon nitride layer 303 and the pad oxide layer 302 are removed, and then subsequent transistor manufacturing processes are completed as described above with reference to FIGS. 16A and 16B through FIGS. 21A and 21B.

As described with reference to exemplary embodiments of the present invention, to form a trench gate type transistor, a gate trench is first formed in a semiconductor substrate and then an isolation trench is formed. In the resultant trench gate type transistor, a recessed channel with an increased length can be formed adjacent to a bottom of a gate trench in a direction in which active regions extend. On the other hand, in a direction perpendicular to the direction in which the active regions extend, a gate insulating layer contacts an isolation layer within the gate trench throughout the entire length of inner walls of the gate trench including an entrance portion of the gate trench to a bottom portion of the gate trench. Thus, a silicon region does not remain between the isolation layer and the gate insulating layer, and channels are not formed adjacent to the gate trench.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
    a semiconductor substrate disposed in a cell array region and including a plurality of active regions;
    a plurality of gate trenches formed in each of the plurality of active regions, each of the gate trenches having first inner walls, which face each other in a first direction, which is perpendicular to a second direction in which the active regions extend, and second inner walls, which face each other in the second direction in which the active regions extend;
    a plurality of gate insulating layers disposed on the first and second inner walls of each of the plurality of gate trenches;
    a plurality of gate electrodes, each of which extends in the first direction and includes a bottom gate portion, which fills one of the gate trenches, and a top gate portion, which is disposed over the semiconductor substrate;
    an isolation layer, which contacts the gate insulating layer throughout the entire length of the first inner walls of the gate trenches including from entrance portions of the gate trenches to bottom portions of the gate trenches;
    a plurality of source/drain regions disposed in the semiconductor substrate at both sides of each of the gate electrodes; and a plurality of channel regions disposed adjacent to the gate insulating layers in the semiconductor substrate along the second inner walls and the bottom portions of the gate trenches.

2. The device of claim 1, wherein the width of the bottom gate portion of each of the gate electrodes in the first direction is defined by the isolation layer.

3. The device of claim 1, wherein the bottom gate portion of each of the gate electrodes has a width in the first direction that is greatest at the bottom of the bottom gate portion.

4. The device of claim 1, wherein the cell array region constitutes a dynamic random access memory device.

5. A semiconductor device comprising:
a semiconductor substrate including a plurality of active regions;
a plurality of gate trenches formed in each of the plurality of active regions, each of the gate trenches having inner walls;
a plurality of gate insulating layers each disposed on a corresponding inner wall of each of the plurality of gate trenches;
a plurality of gate electrodes, each of which includes a bottom gate portion, which fills a corresponding gate trench, and a top gate portion, which is disposed over the semiconductor substrate;
an isolation layer, which contacts the gate insulating layer throughout an entire length of the gate trenches including from entrance portions of the gate trenches to bottom portions of the gate trenches;
a plurality of source/drain regions disposed in the semiconductor substrate at both sides of each of the gate electrodes; and
a plurality of channel regions disposed adjacent to the gate insulating layers in the semiconductor substrate along the bottom portions of the gate trenches.

6. The device of claim 5, wherein a width of the bottom gate portion of each of the gate electrodes is defined by the isolation layer.

7. The device of claim 5, wherein the bottom gate portion of each of the gate electrodes has a width that is greatest at the bottom of the bottom gate portion.

8. The device of claim 5, wherein the inner walls of the gate trenches comprise:
first inner walls, which face each other in a first direction, which is perpendicular to a second direction in which the active regions extend; and
second inner walls, which face each other in the second direction in which the active regions extend.

9. The device of claim 8, wherein each of the plurality of gate electrodes extend in the first direction.

10. The device of claim 8, wherein the isolation layer contacts the gate insulating layer throughout the entire length of the first inner walls of the gate trenches including from entrance portions of the gate trenches to bottom portions of the gate trenches.

* * * * *